(12) United States Patent
Morise et al.

(10) Patent No.: US 8,625,335 B2
(45) Date of Patent: Jan. 7, 2014

(54) MAGNETIC STORAGE ELEMENT, MAGNETIC STORAGE DEVICE, AND MAGNETIC MEMORY

(75) Inventors: Hirofumi Morise, Yokohama (JP); Hideaki Fukuzawa, Kawasaki (JP); Akira Kikitsu, Yokohama (JP); Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/238,198

(22) Filed: Sep. 21, 2011

(65) Prior Publication Data

US 2012/0250398 A1 Oct. 4, 2012

(30) Foreign Application Priority Data

Mar. 28, 2011 (JP) ................................. 2011-70884

(51) Int. Cl.
*G11C 11/16* (2006.01)

(52) U.S. Cl.
USPC ........................................ 365/157; 365/158

(58) Field of Classification Search
USPC ................................................ 365/157, 158
See application file for complete search history.

(56) References Cited

U.S. PATENT DOCUMENTS

| 6,834,005 | B1 | 12/2004 | Parkin |
| 2009/0310241 | A1 | 12/2009 | Lee |
| 2010/0135059 | A1* | 6/2010 | Pi et al. ............................ 365/80 |
| 2010/0157663 | A1* | 6/2010 | Lee et al. ....................... 365/158 |

FOREIGN PATENT DOCUMENTS

| JP | 2009-081390 | 4/2009 |
| JP | 2009-301699 | 12/2009 |
| JP | 2010-067791 | 3/2010 |
| WO | 2008120482 | 10/2008 |

OTHER PUBLICATIONS

Japanese Office Action for Japanese Application No. 2011-070884 mailed on Feb. 5, 2013.
Japanese Office Action for Japanese Application No. 2011-070884 mailed on Aug. 20, 2013.

* cited by examiner

*Primary Examiner* — Michael Tran
(74) *Attorney, Agent, or Firm* — Turocy & Watson, LLP

(57) ABSTRACT

A magnetic storage element according to an embodiment includes: a magnetic thin wire extending in a first direction and having a plurality of magnetic domains partitioned by domain walls; an electrode capable of applying a current flowing in the first direction and a current flowing in the opposite direction from the first direction, to the magnetic thin wire; and an assisting unit receiving an electrical input and assisting movement of the domain walls in an entire or part of the magnetic thin wire.

14 Claims, 28 Drawing Sheets

MAGNETIC STORAGE ELEMENT, MAGNETIC STORAGE DEVICE, AND MAGNETIC MEMORY

CROSS-REFERENCE TO RELATED APPLICATION

This application is based upon and claims the benefit of priority from prior Japanese Patent Application No. 2011-70884 filed on Mar. 28, 2011 in Japan, the entire contents of which are incorporated herein by reference.

FIELD

Embodiments described herein relate generally to a magnetic storage element, a magnetic storage device, and a magnetic memory.

BACKGROUND

To realize a memory with a larger capacity, a memory of a spin shift register type that uses domain walls has been suggested. In conventional semiconductor memories, "a storage element, a select element, and an information extracting line" are normally formed in each memory cell. However, this memory of the spin shift register type is based on a concept that only storage elements are arranged at a high density by transferring stored information to the locations of a sensor and a wiring formed in predetermined positions, and such a memory has a possibility of a dramatic increase in memory capacity.

However, a stable shifting operation requires a current with a high current density for the domain walls to transit from a resting state to a moving state. The necessity of a high current and a large amount of power in a shifting operation to be performed frequently is an undesirable aspect in achieving high memory reliability and a smaller power consumption, and the critical current required in a domain-wall shifting operation needs to be lowered.

In a shift register for memories, it is not preferable to provide a control electrode for each bit (or each digit), and a shifting operation needs to be performed on a desired number of digits by applying some effect to the entire bit string. In each shift register that has been suggested for memories, one could manage to shift information in several digits accurately and collectively, but it is not at all easy to shift information in all the digits of information in a magnetic thin wire to realize a large-capacity memory accurately and collectively, which is at least several hundred bits and sometimes can be more than several kilobits to achieve a larger capacity, using the current pulse flowing through the shift register. In a large-capacity memory having a large number of bits in one thin wire, the physical length of the shift register becomes greater, and the possibility of false operations due to rounding of the current pulse waveform caused by the capacity or inductance components might become higher.

DETAILED DESCRIPTION

A magnetic storage device according to an embodiment includes: a magnetic thin wire extending in a first direction and having a plurality of magnetic domains partitioned by domain walls; an electrode capable of applying a current flowing in the first direction and a current flowing in the opposite direction from the first direction, to the magnetic thin wire; and an assisting unit receiving an electrical input and assisting movement of the domain walls in an entire or part of the magnetic thin wire.

The following is a description of embodiments, with reference to the accompanying drawings.

First Embodiment

Figure 1:
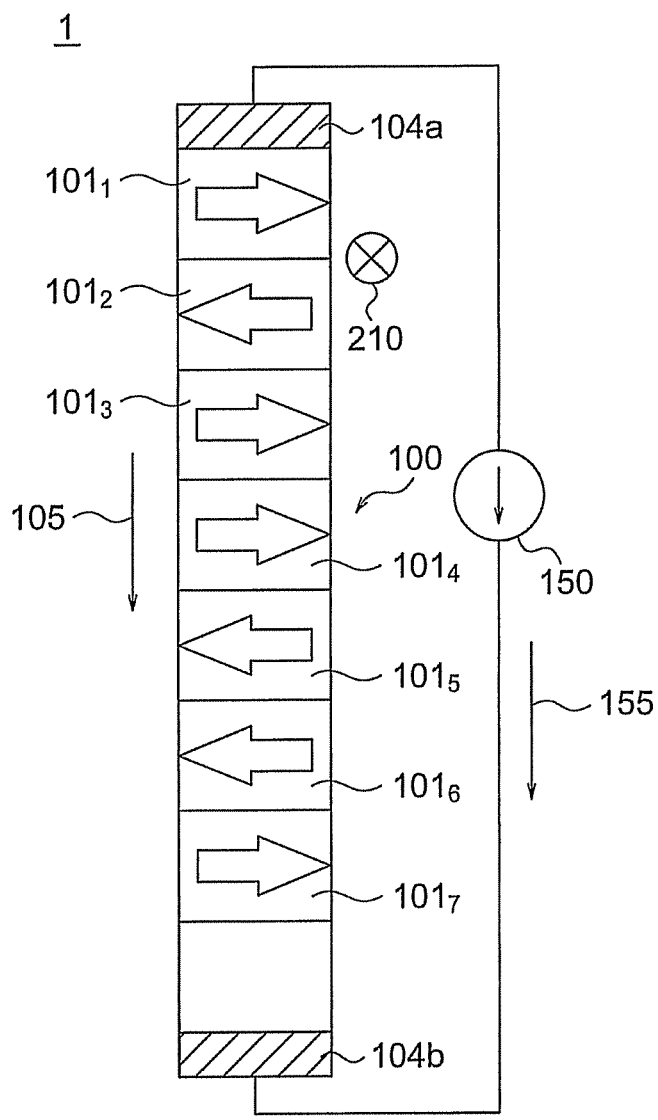
FIG. 1 is a cross-sectional view of a magnetic storage element according to a first embodiment.

A magnetic storage element according to a first embodiment is shown in FIG. 1. FIG. 1 is a cross-sectional view of a magnetic storage element 1 according to the first embodiment. The magnetic storage element 1 of this embodiment includes a magnetic thin wire 100 formed on a substrate (not shown) either via a nonmagnetic layer (not shown) or not via a nonmagnetic layer, electrodes 104a and 104b that are connected to the magnetic thin wire 100 and apply currents to the magnetic thin wire 100, and a wiring 210. The magnetic thin wire 100 has a thin, linear shape extending in one direction. In this specification, the direction in which this thin wire extends is called the thin-wire directions (the first direction). A cross-sectional shape of the magnetic thin wire 100 taken along a plane perpendicular to the thin-wire directions is a rectangular, circular, or elliptical shape. The magnetic thin wire 100 includes magnetic domains $101_1$ through $101_n$ (n being an integer). In FIG. 1, n is 7. A magnetic domain is a region in which the magnetization direction is uniform.

On the boundary between each two adjacent magnetic domains, the magnetization direction continuously changes in the thin-wire directions. The magnetization change regions are called domain walls. A domain wall normally has a finite width w that is determined by the anisotropy energy or exchange stiffness of the magnetic material. When a write unit and a read unit are provided in the magnetic storage element, the magnetization directions of the respective regions each having a predetermined length in the thin-wire directions are associated with bit data "0" or "1." Therefore, when data "00011011" is stored in the magnetic storage element, a domain wall exists on each boundary between the region corresponding to the third bit and the region corresponding to the fourth bit, between the region corresponding to the fifth bit and the region corresponding to the sixth bit, and between the region corresponding to the sixth bit and the region corresponding to the seventh bit. The amount of data stored in one magnetic storage element is a hundred bits to several thousands of bits. In FIG. 1, the magnetization direction of each magnetic domain is perpendicular, but can be parallel. In this specification, a perpendicular magnetization direction is a magnetization direction that is perpendicular to the thin-wire directions. The materials that can be used for the magnetic thin wire 100 will be described later.

Figure 2:
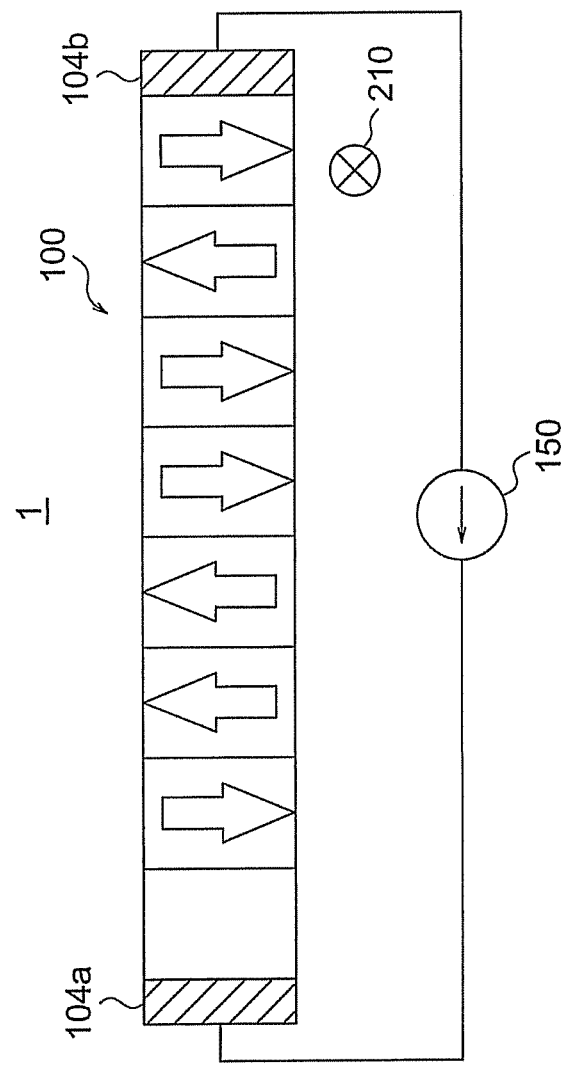
FIG. 2 is a cross-sectional view of a magnetic storage element according to a first modification of the first embodiment.
Figure 3:
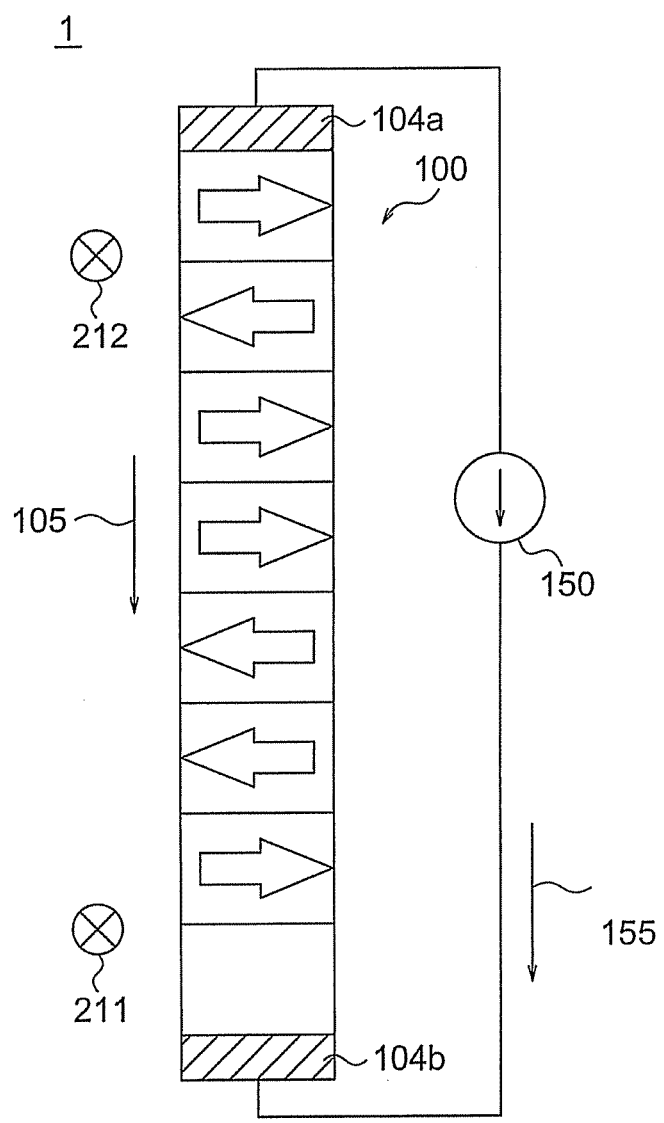
FIG. 3 is a cross-sectional view of a magnetic storage element according to a second modification of the first embodiment.

A current source 150 is connected to the magnetic thin wire 100 via the electrodes 104a and 104b, and currents can be applied in both of the thin-wire directions of the magnetic thin wire 100. The wiring 210 is positioned in the vicinity of the magnetic thin wire 100, and is electrically insulated from the magnetic thin wire 100. In FIG. 1, the magnetic thin wire 100 is positioned so that the thin-wire directions are perpendicular to the substrate surface (the upper face of the substrate, for example). However, as in a magnetic storage element 1 of a first modification illustrated in FIG. 2, the magnetic thin wire 100 can be positioned so that the thin-wire directions are parallel to the substrate surface. Further, as in a second modification shown in FIG. 3, multiple (two in FIG. 3) wirings 211 and 212 can be provided for one magnetic thin wire 100.

The magnetic storage element 1 of this embodiment is manufactured by a film forming technique and a fine processing technique. The manufacturing method will be described later in detail.

The magnetic storage element 1 of this embodiment can move each domain wall in the magnetic thin wire 100 by a predetermined distance in the thin-wire directions, using the wiring 210 and the current source 150. The procedures for this are described as follows.

First, from time $t_2$ to time $t_3$ ($>t_2$), a procedure called an assisting procedure for applying a current to the wiring 210 is carried out. A current magnetic field having components perpendicular to the magnetization of the magnetic thin wire 100 is generated around the wiring 210. If there are multiple wirings 210, the current is applied to at least one of the wirings 210. A partial region (called an excitation region) in the magnetic thin wire 100 is affected by the current magnetic field, and has fluctuations in its magnetization direction, and the width of each domain wall in the excitation region becomes greater. There is a dipole-dipole interaction and an exchange interaction between magnetizations in the magnetic thin wire 100, and therefore, the fluctuations in the magnetization direction propagate through the magnetic thin wire 100. As a result, the widths of the domain walls outside the excitation region in the magnetic thin wire 100 also become greater than those observed prior to the generation of the current magnetic field. The current applied to the wiring 210 can be a pulse current or an alternating current. In the case of an alternating current, the current preferably has a frequency close to the ferromagnetic resonance frequency of the magnetic material forming the magnetic thin wire 100. This is because the sensitivity to a magnetic field becomes higher in the vicinity of a resonance frequency, and fluctuations can be caused in a magnetization direction by a low current.

At time $t_1$, a current 155 is applied to the magnetic thin wire 100 with the use of the current source 150.

As is well known, when a current is applied to a magnetic material, the current is spin-polarized in the magnetization direction. At a domain wall, the magnetization direction spatially changes. Therefore, the spin-polarization direction of the current 155 also spatially changes, and in reaction to that, the magnetization is subjected to a torque from the current 155. If the current value is equal to or larger than a threshold value, the domain walls in the magnetic thin wire 100 move in the electron flowing direction or in the opposite direction 105 from the current 155. When the current 155 is cut off, the domain walls stop moving. Accordingly, the movement distances of the domain walls can be controlled by adjusting the period of time during which the current 155 is applied.

In the magnetic storage element 1 of this embodiment, a torque is supplied, with the domain wall widths being made greater. Therefore, the total amount of magnetization involving torque passing becomes larger. Accordingly, the domain wall movement efficiency becomes higher than that achieved when a magnetic field is not generated by a current applied to the wiring 210. Thus, the domain walls can be moved by a lower current and/or in a shorter period of time, and the stability in the movement of the domain walls is dramatically improved, compared with the stabilities in conventional cases. That is, in this embodiment, the movement of the domain walls is assisted by application of a current to the wiring 210, and the wiring 210 forms an assisting unit.

Figure 4:
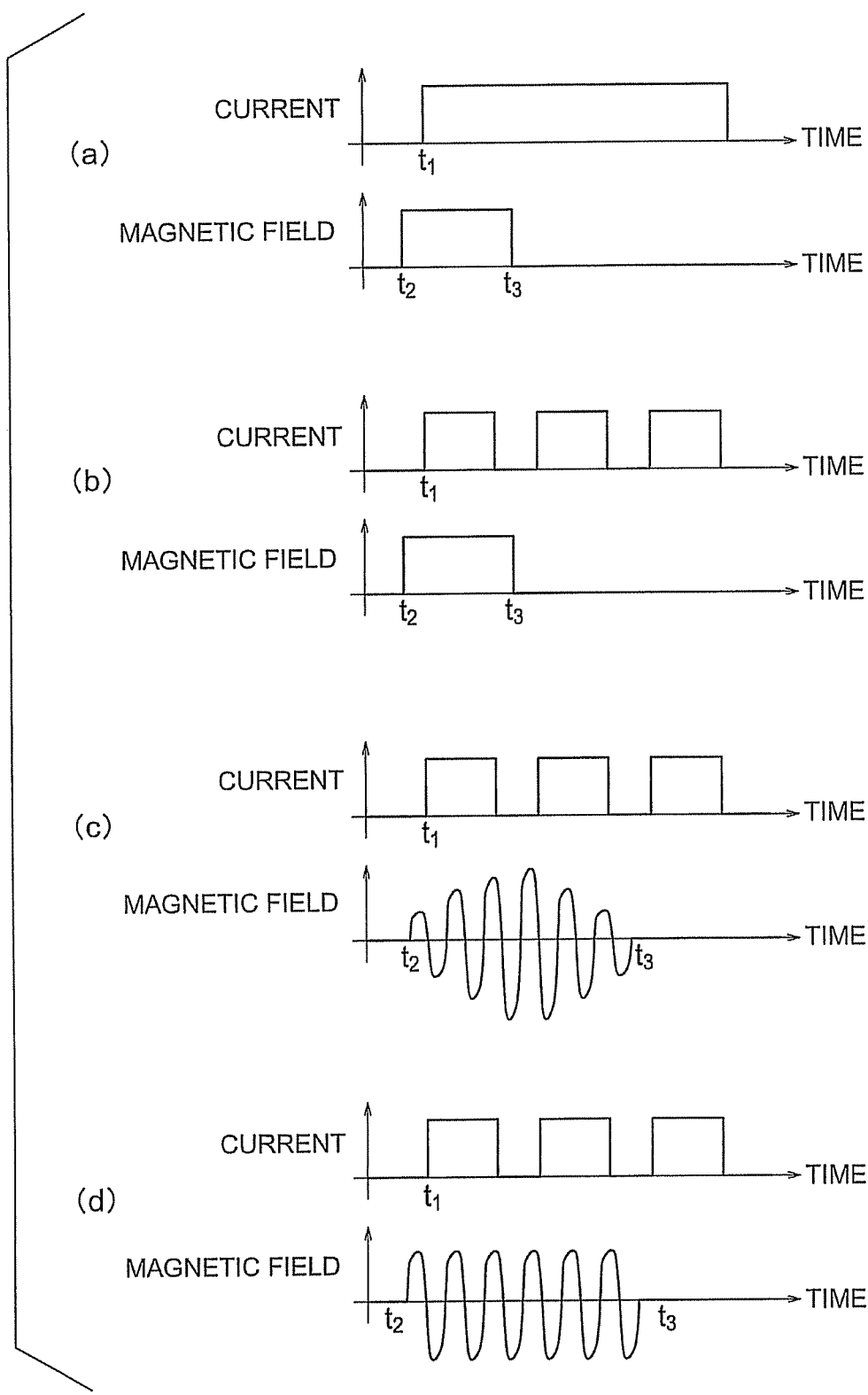
FIGS. 4(a) through 4(d) are timing charts showing the waveforms of the currents and magnetic fields to be applied to the magnetic thin wire of a magnetic storage element of an embodiment.

The above procedures can be expressed in the timing shown in FIG. 4(a). The time for the domain walls to start moving is the time when a current and a magnetic field are supplied at the same time. If t2≤t1, the time for the domain walls to start moving is t1. If t1≤t2, the time for the domain walls to start moving is t2. In particular, the time t1 is preferably equal to or later than time t2 (t2≤t1). When a current is applied to more than one wiring, the condition, t2≤t1, is preferably satisfied for each of the wirings to which the current is applied. In that case, the movement of the domain walls starts at time t1 and ends at the time when the supply of the current stops, and the movement period of the domain walls is determined by the period of time during which the current is applied. Therefore, the domain walls are moved by a predetermined distance with excellent precision. The current can be applied as a pulse current formed by dividing timewise the current 155, as shown in FIG. 4(b). This application of current is effective in controlling the timing to stop the moving domain walls. Further, where the current magnetic field is an AC magnetic field, as described above, timing charts are as shown in FIGS. 4(c) and 4(d). FIG. 4(c) illustrates a case where the amplitude of the alternating current changes. FIG. 4(d) illustrates a case where the amplitude of the alternating current is constant. The waveform of the magnetic field shown in FIG. 4(c) is the magnetic field accompanying spin waves generated in each magnetic storage element of the later described second through fourth embodiments.

The wiring 210 is preferably located in a position near the input portion for the current 155. When multiple wirings 210 are provided in the magnetic storage element 1 and a current is applied only to one or some of the wirings, it is preferable to selectively apply the current to the wiring(s) 210 closest (closer) to the input portion for the current 155. Here, the input portion for the current 155 in the magnetic thin wire 100 is defined by the direction in which the current 155 is applied. The reason for that is described with reference to FIG. 3, which illustrates a specific example. When the current 155 is applied in the direction shown in FIG. 3, the domain walls move in the opposite direction from the current 155. When the current 155 is applied only to the wiring 211 located closer to the input portion for the current 155 between the wiring 211 and the wiring 212 for generating magnetic fields, the domain walls on the side toward which the domain walls are moving start moving in a shorter period of time. With this arrangement, each domain wall is prevented from catching up with and overtaking the other domain walls.

Figure 5:
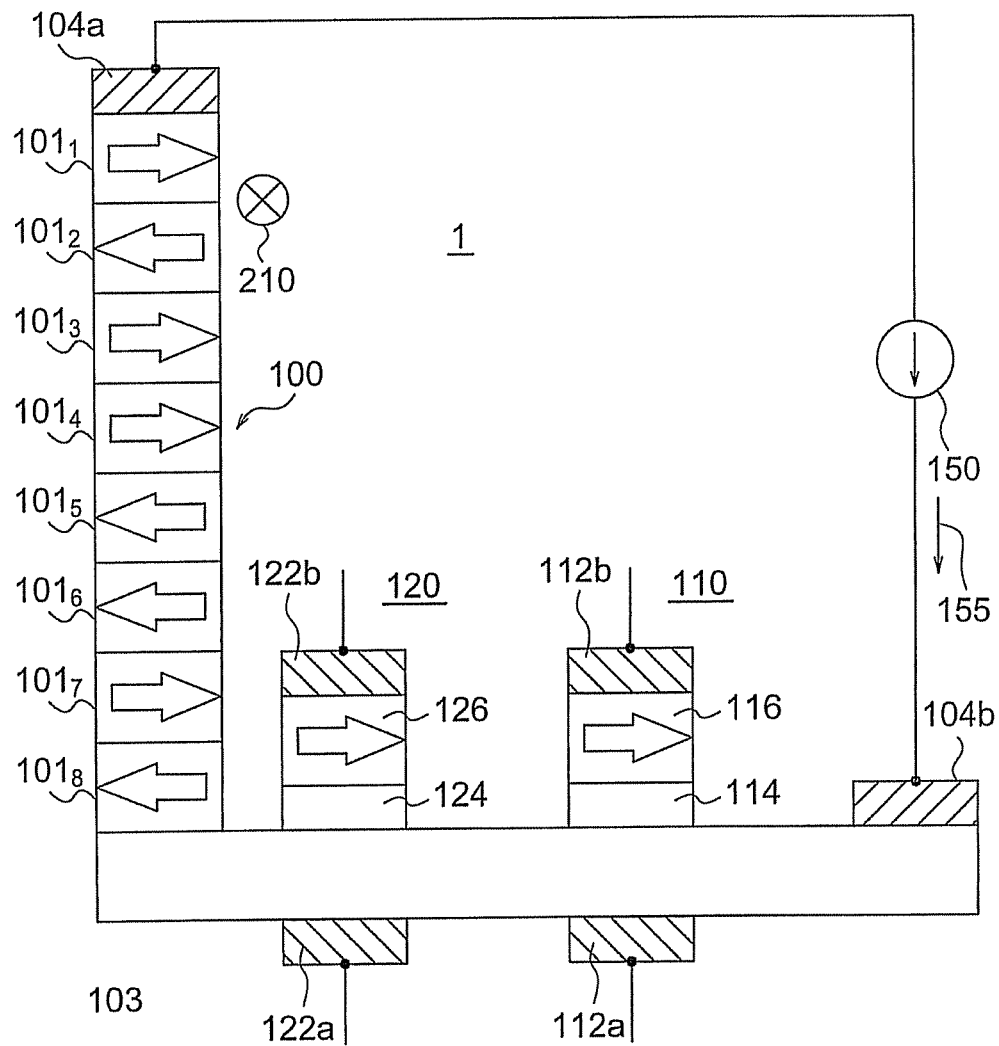
FIG. 5 is a cross-sectional view for explaining writing and reading in the magnetic storage element according to the first embodiment.

Referring now to FIG. 5, reading and writing methods for the magnetic storage element 1 of the first embodiment and a first modification are described. FIG. 5 is a diagram for illustrating writing and reading methods for the magnetic storage element 1 according to the first embodiment illustrated in FIG. 1. In this magnetic storage element 1, the first electrode 104a is provided at one terminal of the magnetic thin wire 100 or in the region to be the magnetic domain 101₁, and a magnetic thin wire 103 is provided at the other terminal. The magnetic thin wire 103 is used for writing and reading, and the thin-wire direction thereof is perpendicular to the thin-wire direction of the magnetic thin wire 100. The second electrode 104b of the magnetic storage element 1 is provided at the other terminal of the magnetic thin wire 103. A current is applied between the electrodes 104a and 104b, so that the domain walls in the magnetic thin wire 100 move. A writing unit 110 and a reading unit 120 are provided on the magnetic thin wire 103. The writing unit 110 has an electrode 112a formed on a face thereof, with the magnetic thin wire 103 being interposed between the face and the other parts of the writing unit 110. The writing unit 110 has a nonmagnetic layer 114 formed on the opposite side of the magnetic thin wire 103 from the electrode 112a. A magnetization fixed layer 116 having a fixed magnetization is formed on the nonmagnetic layer 114, and an electrode 112b is formed on the magnetization fixed layer 116.

The reading unit 120 has an electrode 122a formed on a face thereof, with the magnetic thin wire 103 being interposed between the face and the other parts of the reading unit 120. The reading unit 120 has a nonmagnetic layer 124 formed on the opposite side of the magnetic thin wire 103 from the electrode 122a. A magnetization fixed layer 126 having a fixed magnetization is formed on the nonmagnetic layer 124, and an electrode 122b is formed on the magnetization fixed layer 126.

First, writing is described as follows. The current 155 is applied between the electrodes 104a and 104b from the current source 150, and a current is also applied to the wiring 210. By doing so, the domain walls are moved so that the region on which writing is to be performed in the magnetic thin wire 100 moves to a position between the electrode 112a and the nonmagnetic layer 114 of the writing unit 110. After that, a current is applied between the electrodes 112a and 112b of the writing unit 110, to perform writing on the region on which writing is to be performed.

When writing is performed so as to obtain a magnetization in the same direction as the magnetization direction of the magnetization fixed layer 116, a current is applied from the electrode 112a to the electrode 112b via the magnetic thin wire 103, the nonmagnetic layer 114, and the magnetization fixed layer 116. In this case, electrons flow in the opposite direction from the current, and therefore, electrons flow from the electrode 112b to the electrode 112a via the magnetization fixed layer 116, the nonmagnetic layer 114, and the magnetic thin wire 103. At this point, the electrons that have passed through the magnetization fixed layer 116 are spin-polarized, and the spin-polarized electrons flow, through the nonmagnetic layer 114, into the region on which writing is to be performed in the magnetic thin wire 103. The spin-polarized electrons having spins in the same direction as the magnetization direction in the region on which writing is to be performed pass through the region on which writing is to be performed, but the spin-polarized electrons having spins in the opposite direction from the magnetization direction in the region on which writing is to be performed apply a spin torque to the magnetization in the region on which writing is to be performed, so that the magnetization direction in the region on which writing is to be performed becomes the same as the magnetization direction of the magnetization fixed layer 116. Accordingly, the magnetization direction in the region on which writing is to be performed becomes the same as the magnetization direction of the magnetization fixed layer 116.

When writing is performed so as to obtain a magnetization in the opposite direction from the magnetization direction of the magnetization fixed layer 116, a current is applied from the electrode 112b to the electrode 112a via the magnetization fixed layer 116, the nonmagnetic layer 114, and the magnetic thin wire 103. In this case, electrons flow in the opposite direction from the current, and therefore, electrons flow from the electrode 112a to the electrode 112b via the magnetic thin wire 103, the nonmagnetic layer 114, and the magnetization fixed layer 116. At this point, the electrons that have passed through the region on which writing is to be performed in the magnetic thin wire 103 are spin-polarized, and the spin-polarized electrons flow, through the nonmagnetic layer 114, into the magnetization fixed layer 116. The electrons having spins in the same direction as the magnetization of the magnetization fixed layer 116 pass through the magnetization fixed layer 116, but the electrons having spins in the opposite direction from the magnetization of the magnetization fixed layer 116 are reflected by the interface between the nonmagnetic layer 114 and the magnetization fixed layer 116, and flow into the region on which writing is to be performed in the magnetic thin wire 103. The spin-polarized electrons having spins in the opposite direction from the magnetization of the magnetization fixed layer 116 apply a spin torque to the magnetization in the region on which writing is to be performed in the magnetic thin wire 103, so that the magnetization direction in the region on which writing is to be performed becomes the opposite direction from the magnetization of the magnetization fixed layer 116. Accordingly, the magnetization in the region on which writing is to be performed is in the opposite direction from the magnetization of the magnetization fixed layer 116.

Next, the reading method is described as follows. The current 155 is applied between the electrodes 104a and 104b from the current source 150, and a current is also applied to the wiring 210. By doing so, the domain walls are moved so that the region from which reading is performed in the magnetic thin wire 100 is located between the electrode 122a and the nonmagnetic layer 124 of the reading unit 120. After that, a constant current or a constant voltage is applied between the electrodes 122a and 122b of the reading unit 120. At this point, the electrical resistance between the electrodes 122a and 122b varies with the angle between the magnetization direction in the region from which reading is to be performed and the magnetization direction of the magnetization fixed layer 126 (a magnetoresistive effect). Utilizing the magnetoresistive effect, information is read from the region from which reading is to be performed. Specifically, the resistance value has a low (high) value when the magnetization direction in the region from which reading is to be performed and the magnetization direction of the magnetization fixed layer 126 is parallel (antiparallel).

Figure 6:
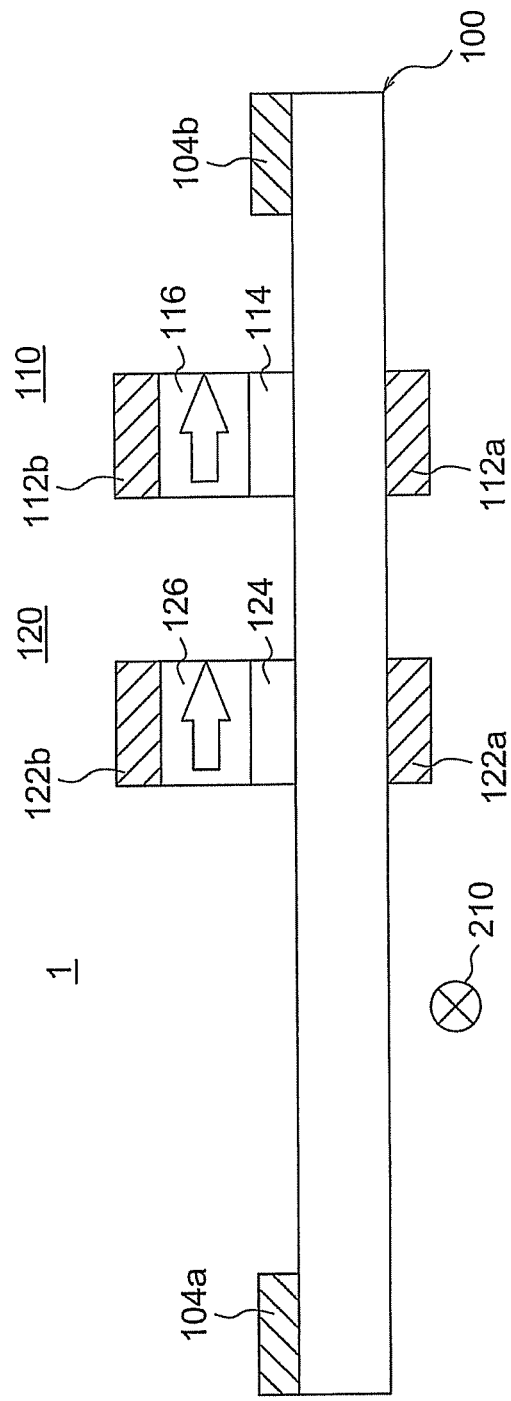
FIG. 6 is a cross-sectional view for explaining writing and reading in the magnetic storage element according to the first modification of the first embodiment.

By the writing method and the reading method for the first modification of the first embodiment, the electrodes 104a and 104b, the writing unit 110, and the reading unit 120 are provided on the magnetic thin wire 100, as shown in FIG. 6. That is, although the writing unit 110 and the reading unit 120 are provided on the magnetic thin wire 103 connected to the magnetic thin wire 100 in the first embodiment, the writing unit 110 and the reading unit 120 are provided on the magnetic thin wire 100 in the first modification. The writing method and the reading method according to the first modification are implemented in the same manner as those according to the first embodiment.

Next, the material of the magnetic thin wire 100 is described.

Various kinds of magnetic materials can be used as the magnetic thin wire 100. For example, a magnetic alloy containing at least one element selected from the group consisting of iron (Fe), cobalt (Co), nickel (Ni), manganese (Mn), and chromium (Cr) can be used. Typical examples include permalloy (a FeNi alloy) and a CoFe alloy. In particular, a magnetic material having a large uniaxial anisotropy constant $K_u$ and a perpendicular magnetic anisotropy can be used. Where a material with a large anisotropy constant $K_u$ is used, the domain wall widths are small when a magnetic field or a current is not being applied. Therefore, if a material with a large anisotropy constant $K_u$ is used as the magnetic thin wire 100 in this embodiment, the effect to increase the domain wall widths can be easily achieved when a magnetic field is applied. Accordingly, the use of such a material is preferable. Examples of such materials include an alloy containing one or more elements selected from the group consisting of Fe, Co, Ni, Mn, and Cr, and one or more elements selected from the group consisting of Pt, Pd, Ir, Ru, and Rh. The value of the uniaxial anisotropy constant can be adjusted by controlling the composition of the magnetic material forming the magnetic layer or the crystal regularity achieved by a heat treatment.

It is also possible to use a magnetic material having a crystalline structure such as a hexagonal close-packed (hcp) structure and having a perpendicular magnetic anisotropy. Such a magnetic material typically contains a metal having Co as a main component, but can be some other metal having an hcp structure.

The magnetization direction of the magnetic thin wire 100 can be either perpendicular or parallel to the thin-wire direction, but is preferably perpendicular to the thin-wire direction to reduce the current value required for moving the domain walls, for example.

When the magnetic thin wire 100 is designed to have a thin-wire direction perpendicular to the substrate, the easy axis of the magnetic anisotropy is in the film plane, and therefore, the magnetization direction can be oriented in a direction perpendicular to the thin-wire direction of the magnetic thin wire 100. Examples of materials each having a large magnetic anisotropy and the easy axis of the magnetic anisotropy in the film plane include Co, a CoPt alloy, and a CoCrPt alloy. CoPt and CoCrPt can be alloys. These materials are metal crystals having the c-axis of the hcp structure in the film plane. Further, an additional element can be added in any case of the above-mentioned materials.

When the magnetic thin wire 100 is designed to have a thin-wire direction parallel to the substrate surface, the easy axis of the magnetic anisotropy is in a direction perpendicular to the film plane, and therefore, the magnetization direction can be oriented in a direction perpendicular to the thin-wire direction of the magnetic thin wire 100. Examples of materials realizing this include a Co layer, a CoPt layer, a FePt layer, a film stack of Co/Ni, and a TbFe layer each having the c-axis of the hcp structure oriented in a direction perpendicular to the film plane. It should be noted that CoPt can be an alloy. In the case of a TbFe layer, if Tb is not less than 20 atomic % and not more than 40 atomic %, the TbFe layer has a perpendicular anisotropy. Further, in the case of any of the above-mentioned materials, an additional element can be added.

Further, a material that is an alloy of a rare-earth element and an iron group transition element and has a perpendicular magnetic anisotropy can be used as the material of the magnetic thin wire 100. Specific examples of such materials include GdFe, GdCo, GdFeCo, TbFe, TbCo, TbFeCo, GdTbFe, GdTbCo, DyFe, DyCo, or DyFeCo.

The magnetic thin wire 100 preferably has each side of a cross-section or a diameter that is not less than 2 nm and not more than 100 nm, so as not to generate a magnetization distribution in the cross-section perpendicular to the thin-wire direction. The longer the magnetic thin wire 100 in the thin-wire direction is, the more magnetic domains can be included in the magnetic thin wire 100. However, when the entire length becomes extremely great, the electrical resistance of the entire magnetic thin wire 100 becomes higher. Therefore, the length of the magnetic thin wire 100 in the thin-wire direction is typically in the range of 100 nm to 10 μm.

Regions having a different cross-sectional area from the other portions, such as notches and concavities, can be formed in the magnetic thin wire 100 at regular intervals in the thin-wire direction. In this case, the pinning potential becomes higher for the domain walls than when no notches are formed, and it is easier for the domain walls to stop. However, the current required for a transition from a resting state to a moving state becomes higher. The magnetic storage element of this embodiment can increase the domain wall widths even in such a case, by virtue of the action of the assisting unit. Accordingly, the domain walls can be moved by a lower current, and this embodiment proves effective.

The magnetic properties can be adjusted by adding a nonmagnetic element, such as Ag, Cu, Au, Al, Mg, Si, Bi, Ta, B, C, O, N, Pd, Pt, Zr, Ir, W, Mo, Nb, or H, to the above described material used as the magnetic thin wire 100. Further, other various physical properties, such as the crystallinity, the mechanical properties, and the chemical properties, can be adjusted.

(Simulation Results)

Figure 7:
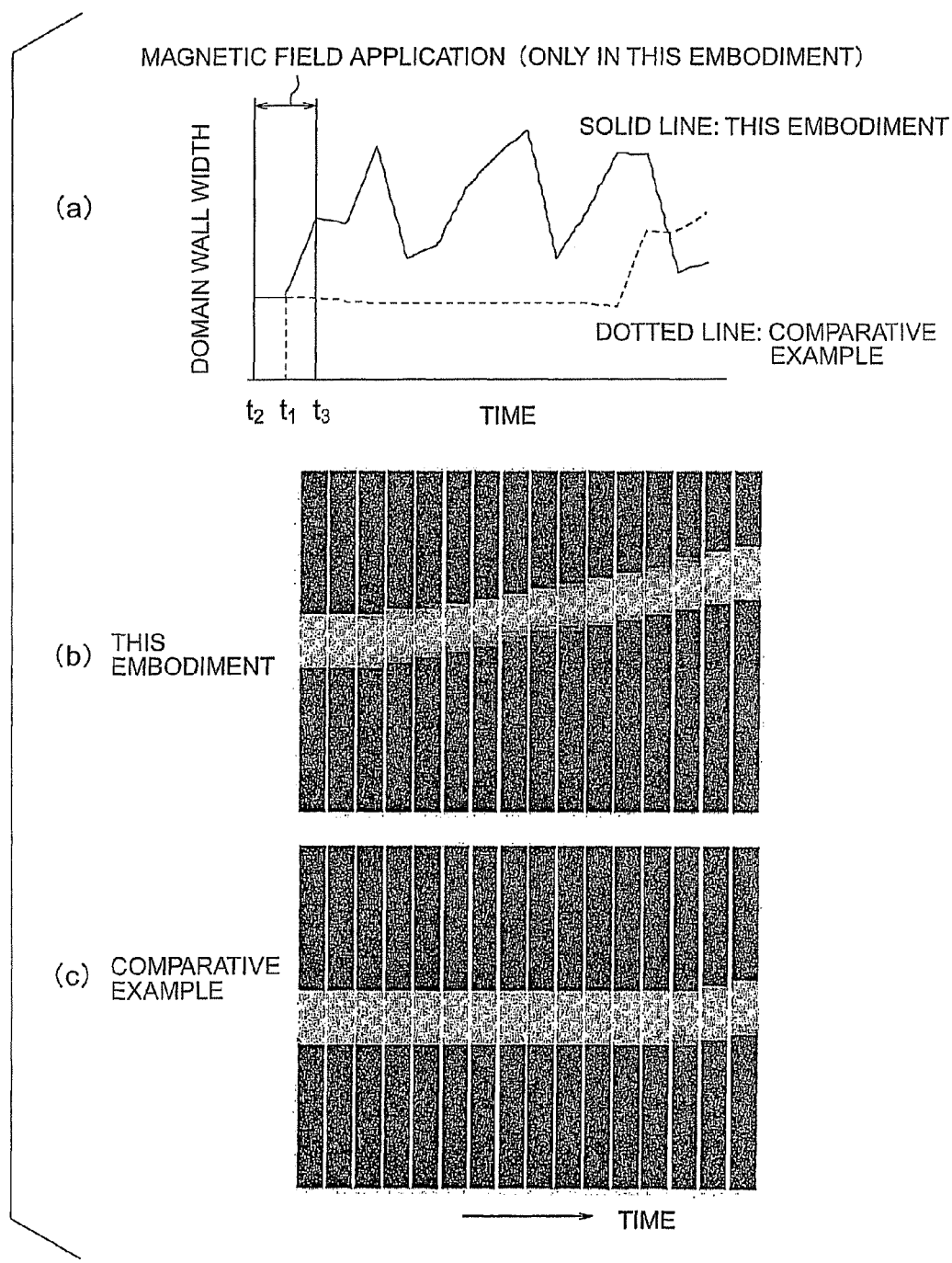
FIGS. 7(a) through 7(c) are diagrams showing the domain wall widths and magnetization distribution periods in the first embodiment and a comparative example.

A simulation was performed to compare the magnetic storage element 1 of this embodiment with a magnetic storage element according to a comparative example. FIGS. 7(a) through 7(c) show the results of the simulation. In the magnetic storage element of the comparative example, the wiring 210 for applying a magnetic field to the magnetic thin wire 100 is not provided. In the magnetic storage elements of this embodiment and the comparative example, the simulation was performed on the same magnetic materials of the same size under the same conditions, except for the magnetic field application. In this simulation, the magnetization arrangement in which a region having the opposite magnetization direction from those of the surrounding regions is formed in a magnetic material having a thin-wire shape like the magnetic thin wire 100 is set as the initial condition. Changes over time in the magnetic structures caused by applying a current and a magnetic field using a micro-magnetic simulation were observed.

The solid line in FIG. 7(a) and FIG. 7(b) show the simulation results showing the time course of the domain wall width and the time course of the magnetization distribution observed when a magnetic field was applied from time $t_2$ to time $t_3$, and a current is applied after time $t_1$ according to the procedures described in this embodiment. The dotted line in FIG. 7(a) and FIG. 7(c) show the simulation results showing the time course of the domain wall width and the time course of the magnetization distribution observed when a magnetic field was not applied and only a current was applied after time $t_1$ in the magnetic storage element of the comparative example. As can be seen from FIGS. 7(a), 7(b), and 7(c), the domain walls start moving when the domain wall width starts increasing in both magnetic storage elements of this embodiment and the comparative example. Further, it can be seen that, in this embodiment, the domain wall width becomes greater while the magnetic field is being applied. Accordingly, in this embodiment, the period of time between time $t_1$ at which the current application starts and the time at which the domain walls start moving is made much shorter than in the comparative example, and the domain walls can be moved faster than in the comparative example. Since the period of time required until the domain walls start moving can also be shortened by increasing the current, the current can be effectively reduced when the domain walls are moved by applying the current for a certain period of time.

Figure 8:
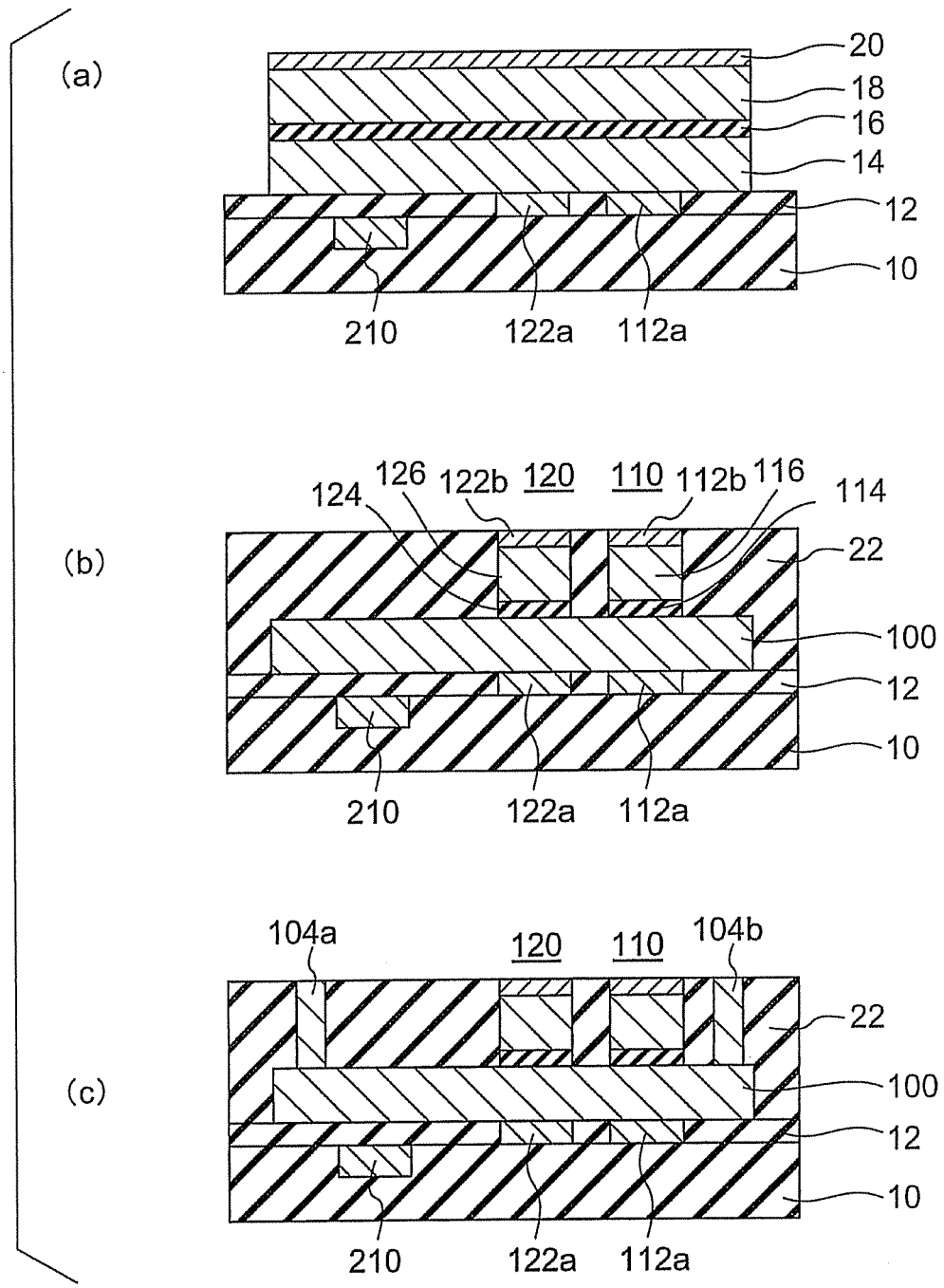
FIGS. 8(a) through 8(c) are cross-sectional views illustrating the method of manufacturing the magnetic storage element according to the first modification of the first embodiment.

Referring now to FIGS. 8(a) through 8(c), a method of manufacturing the magnetic storage element according to the first modification of the first embodiment is described.

First, as shown in FIG. 8(a), a wafer (not shown) having an insulating film 10 formed on the upper face thereof is prepared, and a groove for the wiring 210 generating a current magnetic field is formed in the insulating film 10 by using a lithography technique and Reactive Ion Etching (RIE). A conductive film made of Cu or the like is formed in the groove, to form the wiring 210. After this, an insulating film 12 made of silicon oxide or the like is stacked, and respective grooves for the lower electrode 122a and the lower electrode 112a of the reading unit 120 and the writing unit 110 are formed by using a lithography technique and RIE. A conductive film made of Cu or the like is formed in each of the grooves, to form the lower electrode 122a and the lower electrode 112a. After this, an insulating film (not shown) is further formed, and the insulating film is flattened by using Chemical Mechanical Polishing (CMP), for example, to expose the upper faces of the lower electrode 122a and the lower electrode 112a.

A magnetic layer 14, a nonmagnetic layer 16, a magnetic layer 18, and a protection film 20 are then formed in this order (FIG. 8(a)). The magnetic layer 14 is to be the magnetic thin wire 100. MgO is used as the material of the nonmagnetic layer 16, for example, and the nonmagnetic layer 16 is to be the nonmagnetic layer 114 and the nonmagnetic layer 124 of the writing unit 110 and the reading unit 120. The magnetic layer 18 is to be the magnetization fixed layer 116 and the magnetization fixed layer 126 of the writing unit 110 and the reading unit 120. Ta is used as the protection film 20, for example, and the protection film 20 is to be the upper electrodes 112b and 122b of the writing unit 110 and the reading unit 120. A wafer on which the magnetic layer 14, the nonmagnetic layer 16, the magnetic layer 18, and the protection film 20 are stacked is put into a vacuum furnace in a magnetic field, and annealing is performed in the magnetic field at 270° C. for 10 hours, for example. Thus, the magnetic layers 14 and 18 achieve uniaxial anisotropies. After this, by using a lithography technique and RIE, patterning is performed to re-form the protection film 20, the magnetic layer 18, the nonmagnetic layer 16, the magnetic layer 14 into the planar shape of the magnetic thin wire 100 (FIG. 8(a)).

By using a lithography technique and RIE, patterning is then performed to re-form the protection film 20, the magnetic layer 18, and the nonmagnetic layer 16 into the planar shape of the magnetic thin wire 100, to form the writing unit 110 and the reading unit 120 (FIG. 8(b)). After an interlayer insulating film 22 is deposited, the interlayer insulating film 22 is flattened, to expose the respective upper electrodes 112b and 122b of the writing unit 110 and the reading unit 120 (FIG. 8(b)).

Contact holes connecting to the magnetic thin wire 100 are then formed in the interlayer insulating film 22 by using a lithography technique and RIE, and the contact holes are filled with a conductive film material, to form the electrodes 104a and 104b (FIG. 8(c)). Thus, the magnetic storage element is completed.

As described above, according to the first embodiment, the current density required for the domain walls to transit from a resting state to a moving state can be lowered, and the domain walls can be moved in a stable manner.

Second Embodiment

Figure 9:
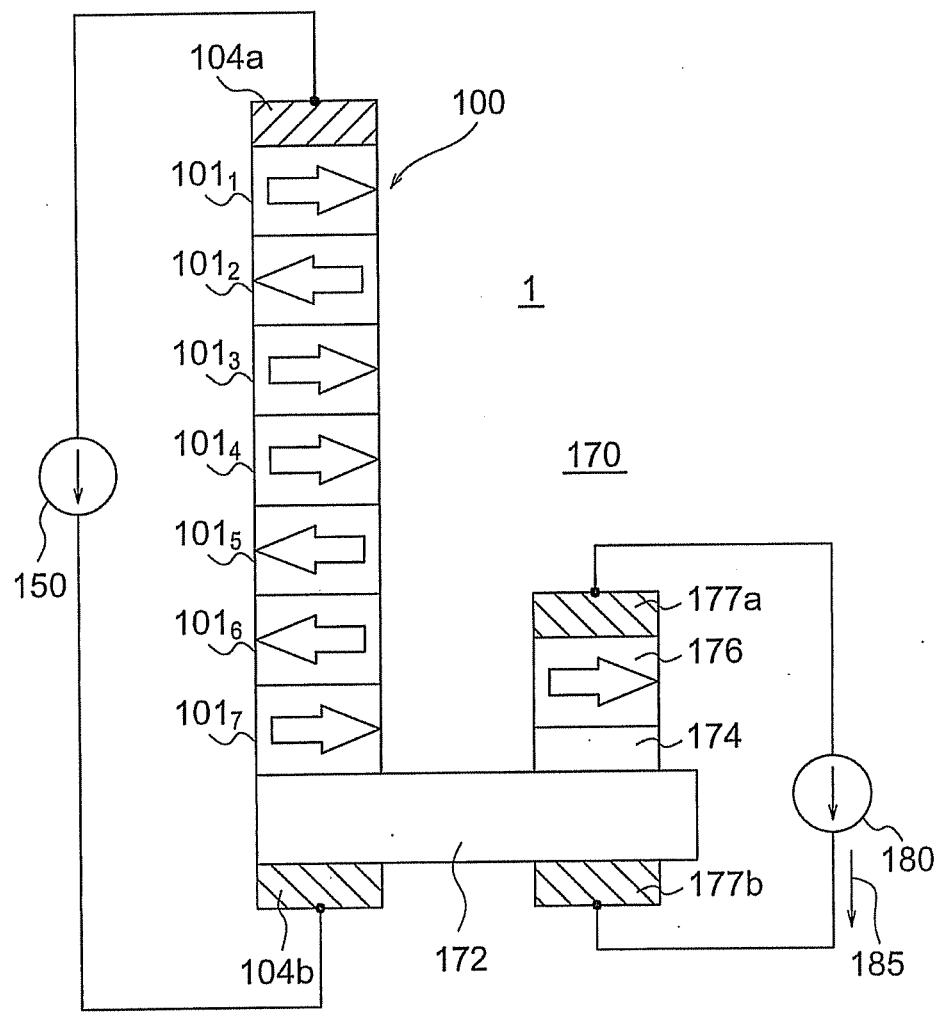
FIG. 9 is a cross-sectional view of a magnetic storage element according to a second embodiment.

FIG. 9 shows a magnetic storage element according to a second embodiment. The magnetic storage element 1 of the second embodiment includes a magnetic thin wire 100 including magnetic domains $101_1$ through $101_n$ (n being an integer), electrodes 104a and 104b applying currents generated from a current source 150 to the magnetic thin wire 100, and a spin wave generator 170 generating spin waves in the magnetic thin wire 100. Although not shown in the drawing, the magnetic storage element 1 of the second embodiment also includes a writing unit and a reading unit, like that of the first embodiment.

Figure 10:
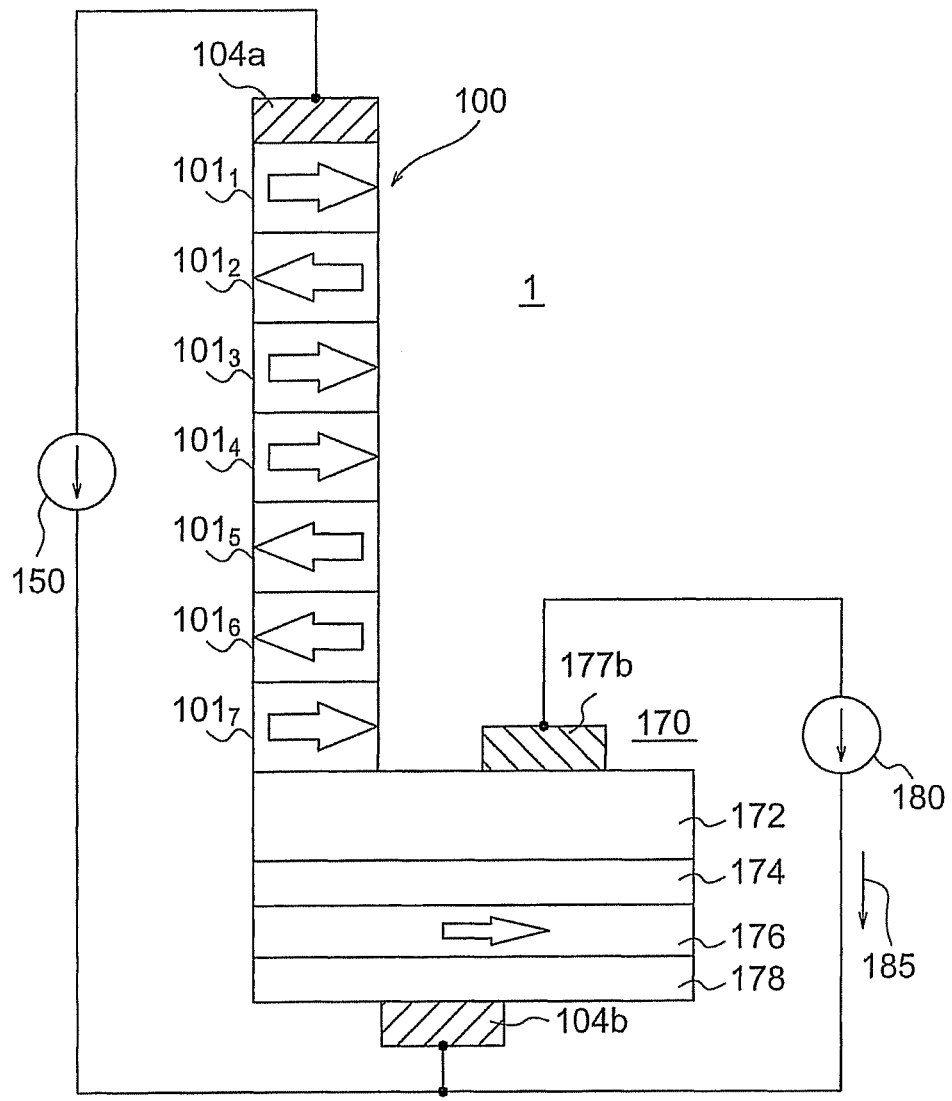
FIG. 10 is a cross-sectional view of a magnetic storage element according to a first modification of the second embodiment.

The spin wave generator 170 includes a magnetic layer 172 that is connected to one terminal of the magnetic thin wire 100 and extends in a direction perpendicular to the thin-wire direction of the magnetic thin wire 100, a nonmagnetic layer 174 formed on the magnetic layer 172, a magnetization fixed layer 176 formed on the nonmagnetic layer 174, and electrodes 177a and 177b applying currents between the magnetic layer 172 and the magnetization fixed layer 176, the currents being generated from a current source 180. In FIG. 9, the nonmagnetic layer 174 and the magnetization fixed layer 176 of the spin wave generator 170 are formed on the face of the magnetic layer 172 on the same side as the magnetic thin wire 100, but can be formed on the face of the magnetic layer 172 on the opposite side from the magnetic thin wire 100, as in a first modification illustrated in FIG. 10. In such a case, the electrode 104b also serves as the electrode 177a.

To increase thermal disturbance endurance, the film thickness of the magnetization fixed layer 176 can be made greater, or an antiferromagnetic layer 178 for fixing magnetization can be formed on the face of the magnetization fixed layer 176 on the opposite side from the nonmagnetic layer 174. Although not shown in the drawing, the antiferromagnetic layer 178 can also be formed on the face of the magnetization fixed layer 176 on the opposite side from the nonmagnetic layer 174 in FIG. 9. Further, the current source 150 and the current source 180 can share some of the electrodes, but are designed to be capable of controlling switching on and off of currents independently of each other.

The magnetization directions of the magnetic layer 172 and the magnetization fixed layer 176 can be either parallel (antiparallel) or perpendicular to each other.

In this embodiment, the domain walls in the magnetic thin wire 100 are moved in the following manner. First, as shown in FIG. 4(c), from time $t_2$ to time $t_3$, a current 185 is applied from the current source 180. This procedure is called an assisting procedure. When the assisting procedure is carried out, a spin-polarized current flows into at least part of the region in the magnetic thin wire 100 or the magnetic layer 172, and accordingly, a spin torque is applied, to change the magnetization direction of the magnetic thin wire 100 or the magnetic layer 172. At this point, if the magnetization direction in the region subjected to the spin torque in the magnetic layer 172 is reversed, unintended writing is performed. Therefore, it is necessary to restrict the change in magnetization direction to 90 degrees or smaller or generate a precessional movement of magnetization, to prevent unintended writing. In this case, the change in magnetization propagates as spin waves from the magnetic layer 172 to the magnetic thin wire 100. Accordingly, the domain wall widths in the magnetic thin wire 100 become greater than those observed prior to the current application.

At time $t_1$, a current is applied from the current source 150 into the magnetic thin wire 100. If the current value is equal to or larger than a threshold value, the domain walls in the magnetic thin wire 100 move in the electron flowing direction or in the opposite direction from the current. When the current is cut off, the domain walls stop moving. Accordingly, the movement distances of the domain walls can be controlled by adjusting the period of time during which the current is applied. That is, in this embodiment, the spin wave generator 170 assists movement of the domain walls, and is also called an assisting unit.

In the spin wave generator 170, the angle between the magnetization direction of the magnetization fixed layer 176 and the magnetization direction in the region near the interface between the magnetic layer 172 and the nonmagnetic layer 174 is restricted to 45 to 135 degrees, to prevent unintended magnetization switching. With this arrangement, even if the current 185 continues to be applied, unintended magnetization switching do not occur. Therefore, the angle between the magnetization direction of the magnetization fixed layer 176 and the magnetization direction in the region near the interface between the magnetic layer 172 and the nonmagnetic layer 174 is preferably 90 degrees, for example. Where the magnetization direction of the magnetization fixed layer 176 and the magnetization direction of the magnetic layer 172 are perpendicular to each other, the current required for a change in magnetization can be advantageously reduced. Further, where the angle between the magnetization direction of the magnetization fixed layer 176 and the magnetization direction in the region near the interface between the magnetic layer 172 and the nonmagnetic layer 174 is zero, or where the magnetization directions are parallel to each other, magnetization fluctuations can be caused in the magnetic layer 172 by applying the current 185 with such a polarity that the current 185 flows from the magnetization fixed layer 176 to the magnetic layer 172. When the angle between the magnetization direction of the magnetization fixed layer 176 and the magnetization direction in the region near the interface between the magnetic layer 172 and the nonmagnetic layer 174 is 180 degrees, or where the magnetization directions are antiparallel to each other, magnetization fluctuations can be caused in the magnetic layer 172 by applying the current 185 with such a polarity that the current 185 flows from the magnetic layer 172 to the magnetization fixed layer 176. However, when the magnetization direction of the magnetization fixed layer 176 and the magnetization direction of the magnetic layer 172 are parallel or antiparallel to each other, if the magnitude of the current 185 is equal to or larger than a threshold value and the current applying period of time is equal to or longer than a threshold value determined by the value of the current 185, the magnetization direction in the region subjected to the spin torque in the magnetic thin wire 100 is reversed. Therefore, the magnitude of the current 185 or the current applying period of time needs to be smaller or shorter than the corresponding threshold value. For example, if the magnitude of the current 185 is smaller than the threshold value, a restoring force is generated by the action of the spin torque and the exchange interaction in the magnetic layer 172. Accordingly, stable magnetization oscillations occur, and spin waves are constantly generated, even if the current 185 is not controlled timewise. In view of this, a magnitude of the current 185 smaller than the threshold value is preferable. The proportion of the exchange interaction to the spin torque can be made larger by reducing the planar size of the nonmagnetic layer 174. Accordingly, by doing so, magnetization switching can be made more difficult. Further, by shaping the waveform of the current 185 into that of a periodic pulse or an alternating current, the spin torque can be weakened prior to a magnetization switching, and switching can be prevented. That is, in the second embodiment, magnetization fluctuations can be caused in the magnetic thin wire 100 in a stable manner, and accordingly, a state in which the domain wall widths in the magnetic thin wire 100 are made greater can be achieved over a long distance in the thin-wire direction. Thus, a large number of domain walls can be moved in a stable manner, even if the magnitude of the current applied from the current source 150 is reduced.

Figure 11:
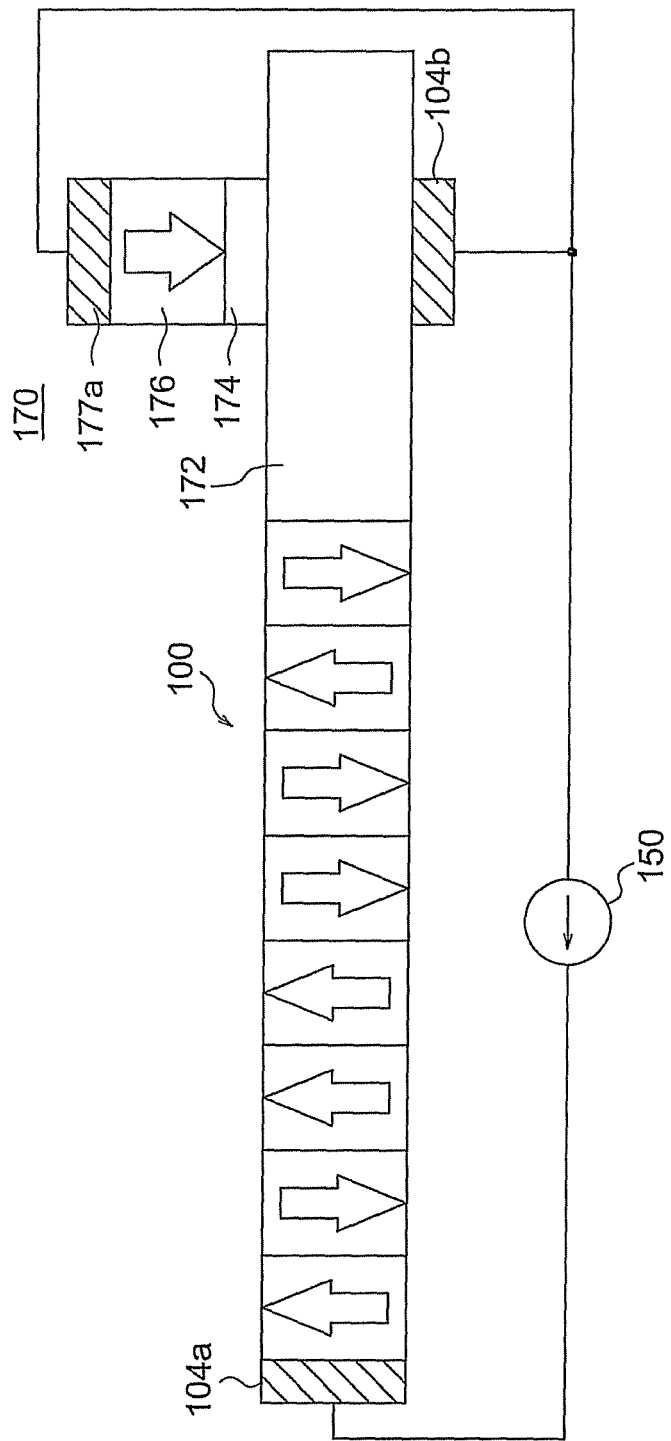
FIG. 11 is a cross-sectional view of a magnetic storage element according to a second modification of the second embodiment.

In each of the magnetic storage elements 1 of the second embodiment and its first modification, the thin-wire direction of the magnetic thin wire 100 is oriented in a direction perpendicular to the substrate surface (the upper face of the substrate, for example). However, the thin-wire direction of the magnetic thin wire 100 can be oriented in a direction parallel to the substrate surface, as in a magnetic storage element 1 of a second modification illustrated in FIG. 11. In this case, the respective layers 172, 174, and 176 of the spin wave generator 170 are formed to extend in directions parallel to the thin-wire direction of the magnetic thin wire 100. In FIG. 11, the current source 150 applying a current to the magnetic thin wire 100 also serves as the current source 180 shown in FIG. 9 or FIG. 10. In this case, the electrode 104b also serves as the electrode 177b.

Next, the materials of the respective layers of each of the magnetic storage elements of the second embodiment and its modifications are described.

The materials that can be used as the material of the magnetic thin wire 100 are the same as those of the first embodiment.

The materials of the magnetic layer 172 and the magnetization fixed layer 176 of the spin wave generator 170 can be selected from various kinds of magnetic materials, as in the first embodiment. The magnetic layer 172, the magnetization fixed layer 176, and the magnetic thin wire 100 can be made of the same material or can be made of different materials from one another.

The material of the antiferromagnetic layer used for fixing the magnetization of the magnetization fixed layer 176 is preferably Fe—Mn, Pt—Mn, Pt—Cr—Mn, Ni—Mn, Pd—Mn, Pd—Pt—Mn, Ir—Mn, Pt—Ir—Mn, NiO, $Fe_2O_3$, or a magnetic semiconductor.

The material of the nonmagnetic layer 174 can be a nonmagnetic metal or an insulating thin film. An element selected from Au, Cu, Cr, Zn, Ga, Nb, Mo, Ru, Pd, Ag, Hf, Ta, W, Pt, and Bi, or an alloy containing one or more of those elements can be used as the nonmagnetic metal. The thickness of the nonmagnetic layer 174 needs to have such a value that the magnetostatic coupling between the magnetization fixed layer 176 and the magnetic layer 172 becomes sufficiently small, and needs to be smaller than the spin diffusion length of the nonmagnetic layer 174. Specifically, the thickness of the nonmagnetic layer 174 is preferably in the range of 0.2 to 20 nm.

As for the insulating material that can be used as the nonmagnetic layer 174, it is possible to use $Al_2O_3$, $SiO_2$, MgO, AlN, $Bi_2O_3$, $MgF_2$, $CaF_2$, $SrTiO_3$, $AlLaO_3$, Al—N—O, Si—N—O, a nonmagnetic semiconductor (ZnO, InMn, GaN, GaAs, $TiO_2$, Zn, Te, or any of those materials doped with a transition metal), or the like. These compounds do not necessarily have completely accurate compositions in terms of stoichiometry, and there can be the absence of oxygen, nitrogen, fluorine, or the like, or there can be an excess and deficiency of any of these materials. The thickness of the nonmagnetic layer 174 made of such an insulating material is preferably not smaller than 0.2 nm and not greater than 5 nm.

As described above, according to the second embodiment, the current density required for the domain walls to transit from a resting state to a moving state can be lowered, and the domain walls can be moved in a stable manner.

Third Embodiment

Figure 12:
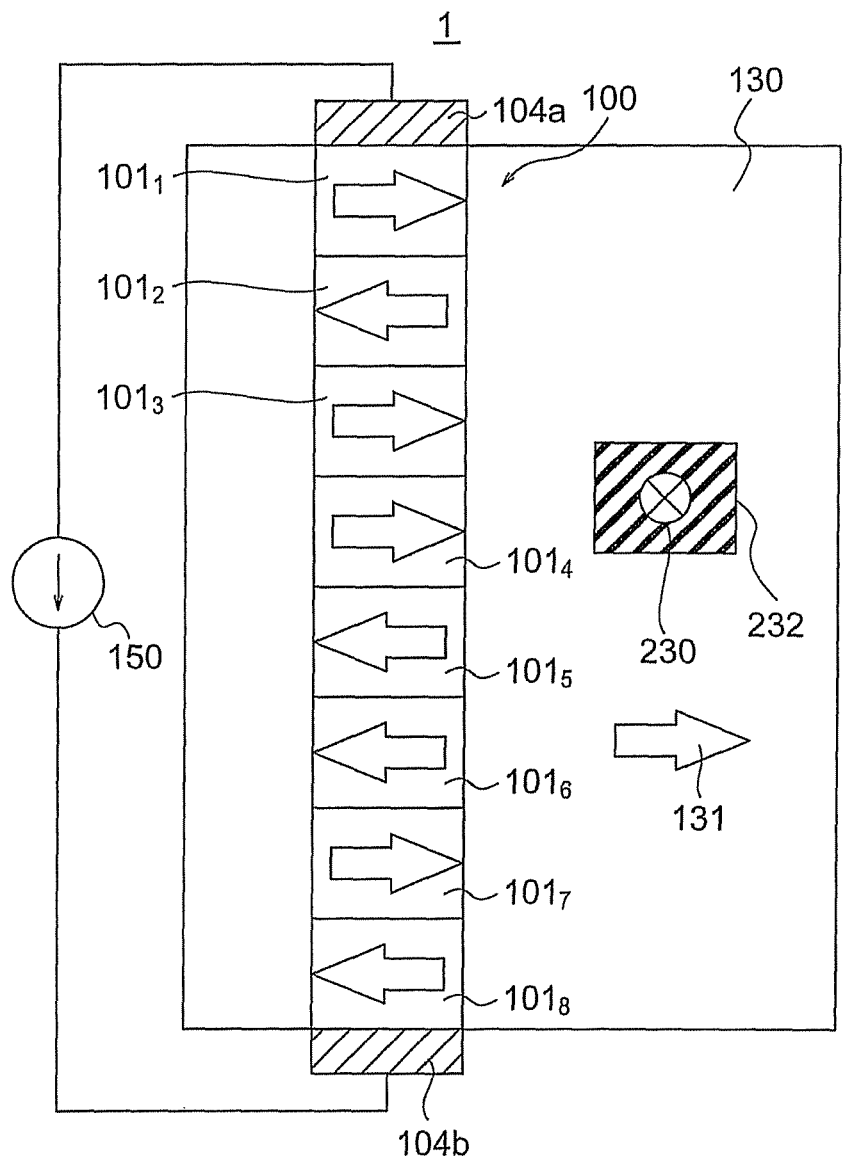
FIG. 12 is a cross-sectional view of a magnetic storage element according to a third embodiment.

FIG. 12 shows a magnetic storage element according to a third embodiment. The magnetic storage element 1 of the third embodiment includes a magnetic thin wire 100 including magnetic domains $101_1$ through $101_n$ (n being an integer), electrodes 104a and 104b applying currents generated from a current source 150 to the magnetic thin wire 100, and a magnetic layer 130 formed to surround the magnetic thin wire 100 according to the thin wiring method for the magnetic thin wire 100, and a wiring 230 formed in the vicinity of the magnetic thin wire 100 in the magnetic layer 130. Although not shown in the drawing, the magnetic storage element 1 of the third embodiment also includes a writing unit and a reading unit, like that of the first embodiment.

In FIG. 12, the wiring 230 is formed to extend in a direction that does not intersect with and is perpendicular to the thin-wire direction of the magnetic thin wire 100. However, the wiring 230 can be formed to extend in a direction parallel to the thin-wire direction of the magnetic thin wire 100, as in a first modification of the third embodiment illustrated in FIG. 13. The magnetic layer 130 and the wiring 230 constitute a spin wave generator.

The magnetic layer 130 is made of an insulating magnetic material or a high-conductivity magnetic material. When the magnetic layer 130 is made of an insulating magnetic material, the magnetic layer 130 can be connected directly to the magnetic thin wire 100. In this case, the distance between the magnetic thin wire 100 and the magnetic layer 130 is short, and therefore, the spin, waves generated in the magnetic layer 130 can be directly made to propagate through the magnetic thin wire 100. As a result, the fluctuation transfer efficiency becomes higher, which is preferable. When the magnetic layer 130 is made of a high-conductivity magnetic material, a nonmagnetic insulator (not shown) needs to be provided between the magnetic layer 130 and the magnetic thin wire 100, so that the magnetic layer 130 and the magnetic thin wire 100 are electrically insulated from each other. As described above, the magnetic layer 130 serves as the layer to generate spin waves and as the layer to transfer the spin waves through the magnetic thin wire 100.

Figure 13:
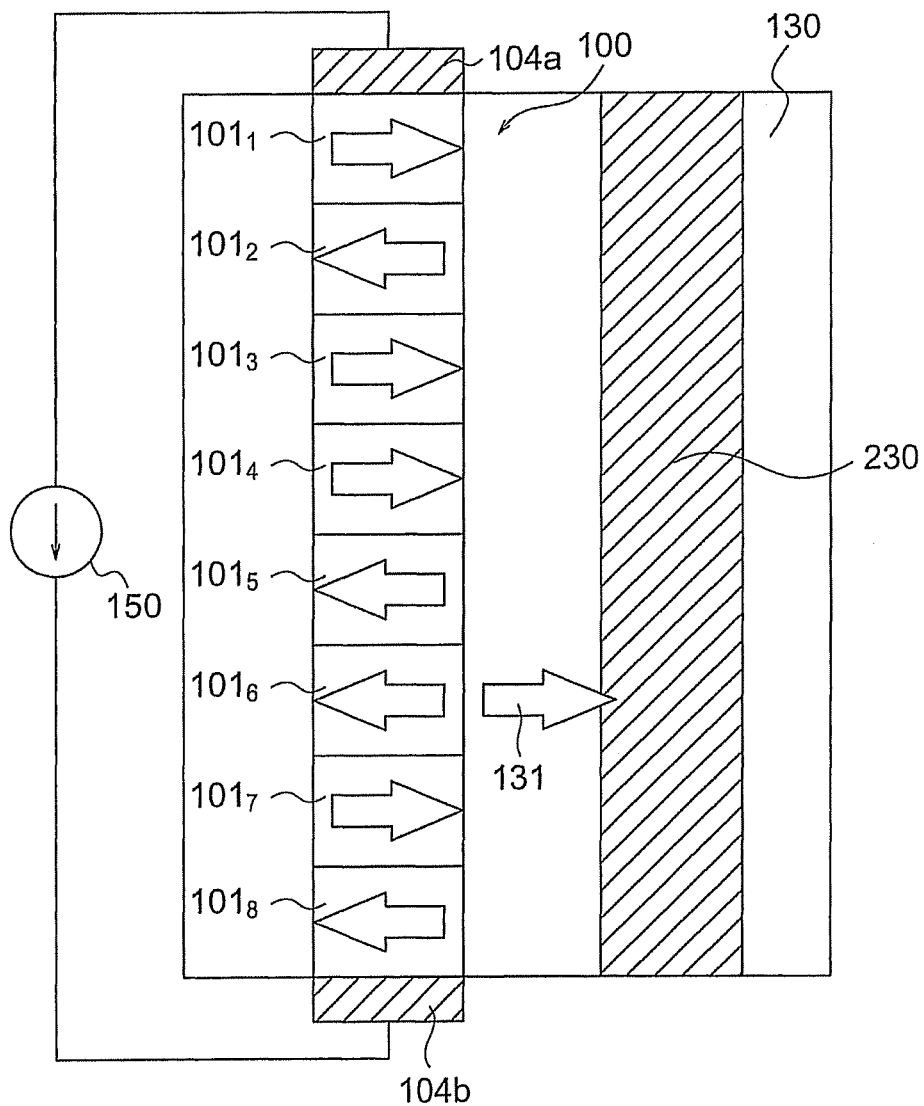
FIG. 13 is a cross-sectional view of a magnetic storage element according to a first modification of the third embodiment.
Figure 14:
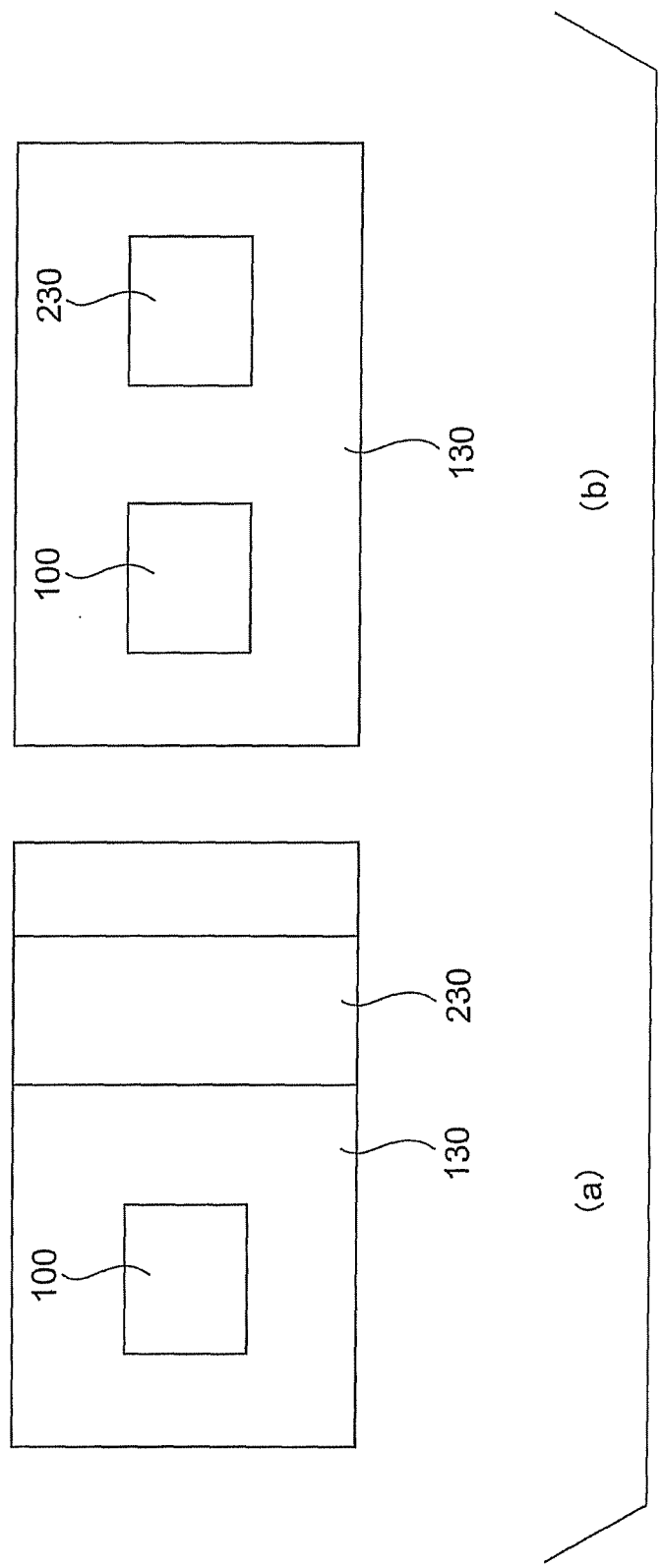
FIGS. 14(a) and 14(b) are plan views of the third embodiment and the first modification, seen from above the substrates.

When the magnetic layer 130 is made of an insulating material, the wiring 230 can be buried in the magnetic layer 130. Alternatively, the wiring 230 is located in a position close to the magnetic layer 130 via an insulator 232, as shown in FIG. 12. The wiring 230 can extend in a direction parallel to the substrate surface as shown in FIGS. 12 and 14(a), or can extend in a direction perpendicular to the surface substrate as shown in FIGS. 13 and 14(b). FIGS. 14(a) and 14(b) are top views of the magnetic storage elements of FIGS. 12 and 13, viewed from above the substrate.

In the third embodiment, the domain walls in the magnetic thin wire 100 are moved in the following manner. First, from time $t_2$ to time $t_3$, a current is applied to the wiring 230. This procedure is called an assisting procedure. When the assisting procedure is carried out, fluctuations are caused in the direction of a magnetization 131 at least in a partial region of the magnetic layer 130, and the fluctuations in the magnetization 131 propagate as spin waves through the magnetic layer 130. Further, a magnetostatic interaction occurs between the magnetization 131 in the magnetic layer 130 and the magnetization in the magnetic thin wire 100. Therefore, fluctuations are caused in the magnetization in the magnetic thin wire 100, and spin waves propagate through the magnetic thin wire 100. Accordingly, the domain wall widths in the magnetic thin wire 100 become greater than those observed prior to the current application, as in the second embodiment. The timing to apply a current with the use of the current source 150 is the same as that of the first embodiment. That is, in this embodiment, the magnetic layer 130 and the wiring 230 assist movement of the domain walls, and constitute an assisting unit.

As described above, according to the third embodiment, the current density required for the domain walls to transit from a resting state to a moving state can be lowered, and the domain walls can be moved in a stable manner.

By using the magnetic storage element of the third embodiment, fluctuations can be caused simultaneously in the domain walls in the magnetic thin wire 100. Accordingly, the domain walls in the magnetic thin wire 100 can be moved concurrently. Further, when the magnetic layer 130 is made of an insulating magnetic material, the distance between the magnetic layer 130 and the magnetic thin wire 100 can be made shorter, and accordingly, fluctuations can be efficiently caused.

Figure 15:
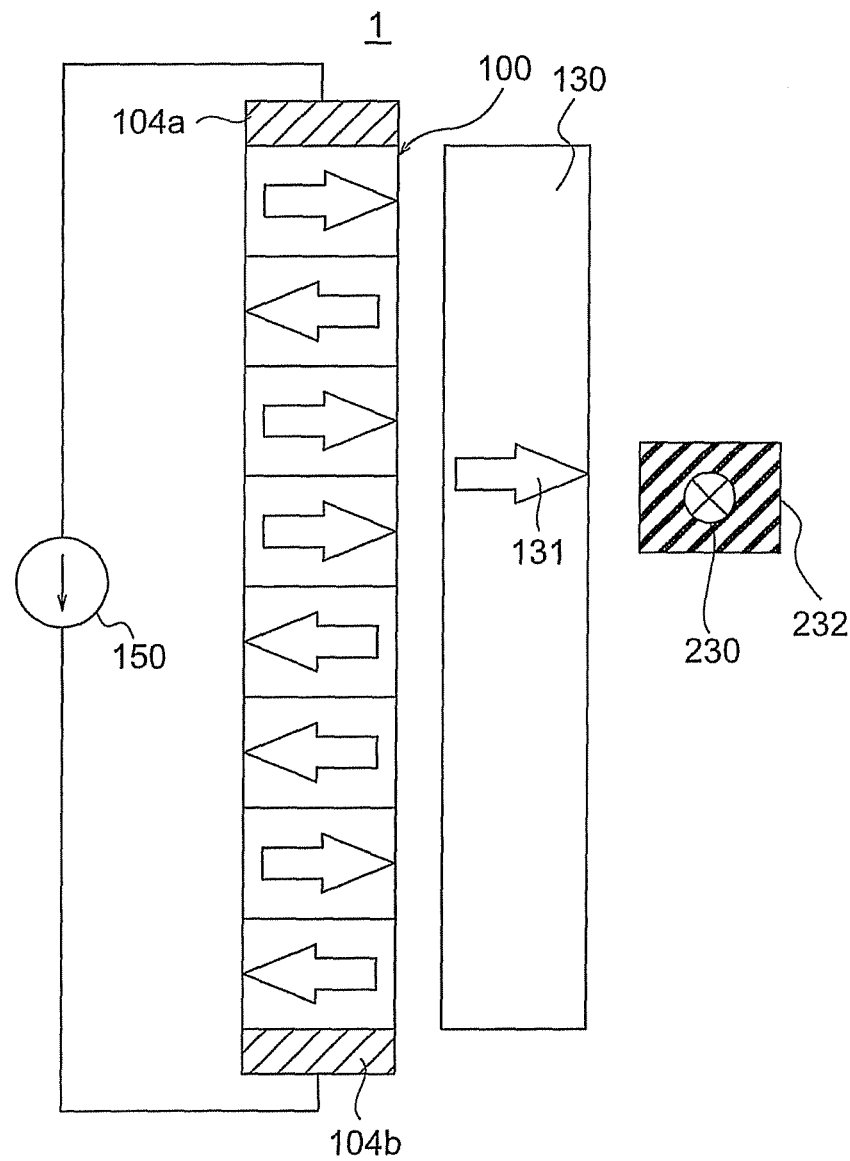
FIG. 15 is a cross-sectional view of a magnetic storage element according to a second modification of the third embodiment.

As in a magnetic storage element 1 according to a second modification of the third embodiment illustrated in FIG. 15, the magnetic layer 130 does not need to be formed to surround the magnetic thin wire 100, and can be located in the vicinity of the entire magnetic thin wire 100. In the second modification illustrated in FIG. 15, the magnetic layer 130 is placed between the magnetic thin wire 100 and the wiring 230, and the wiring 230 extends in a direction that does not intersect with and is perpendicular to the thin-wire direction of the magnetic thin wire 100.

Figure 16:
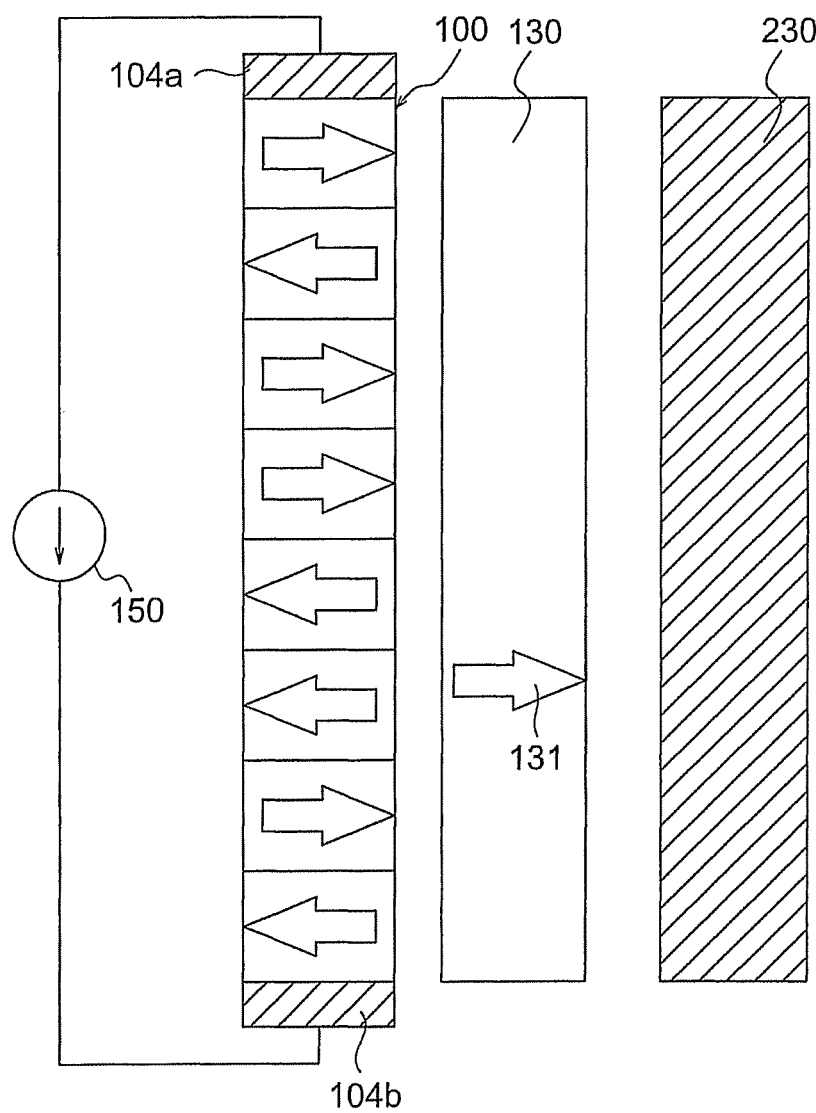
FIG. 16 is a cross-sectional view of a magnetic storage element according to a third modification of the third embodiment.

As in a magnetic storage element 1 according to a third modification of the third embodiment illustrated in FIG. 16, the magnetic layer 130 does not need to be formed to surround the magnetic thin wire 100, and can be located in the vicinity of the entire magnetic thin wire 100. In the third modification illustrated in FIG. 16, the magnetic layer 130 is placed between the magnetic thin wire 100 and the wiring 230, and the wiring 230 extends in a direction parallel to the thin-wire direction of the magnetic thin wire 100.

Figure 17:
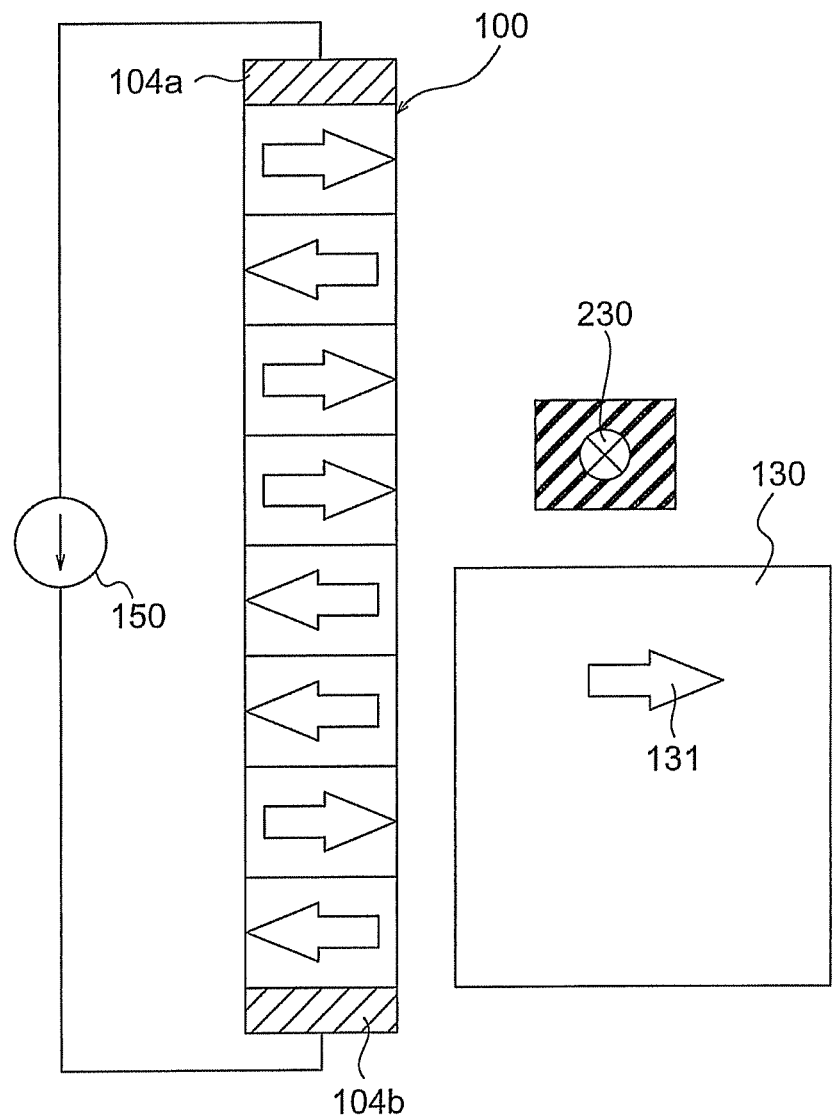
FIG. 17 is a cross-sectional view of a magnetic storage element according to a fourth modification of the third embodiment.

As in a magnetic storage element 1 according to a fourth modification of the third embodiment illustrated in FIG. 17, the magnetic layer 130 does not need to be located in the vicinity of the entire magnetic thin wire 100, and can be located in the vicinity of a partial region of the magnetic thin wire 100. In this case, at least one domain wall in the magnetic thin wire 100 should preferably be close to the magnetic layer 130, so that the effect to increase the domain wall widths is easily achieved.

Figure 18:
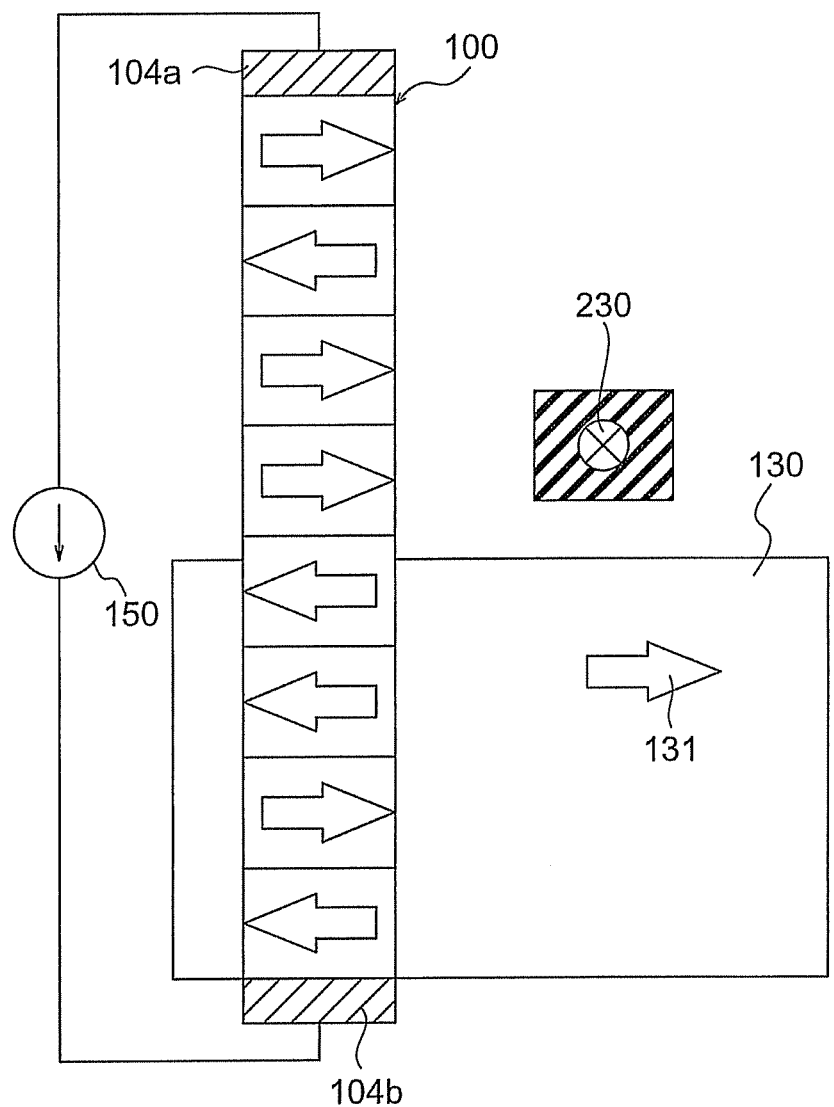
FIG. 18 is a cross-sectional view of a magnetic storage element according to a fifth modification of the third embodiment.

As in a magnetic storage element 1 according to a fifth modification of the third embodiment illustrated in FIG. 18, the magnetic layer 130 can be located to surround a partial region of the magnetic thin wire 100. In this case, the magnetic layer 130 should preferably be positioned to surround at least one domain wall in the magnetic thin wire 100, so that the effect to increase the domain wall widths is easily achieved.

Figure 19:
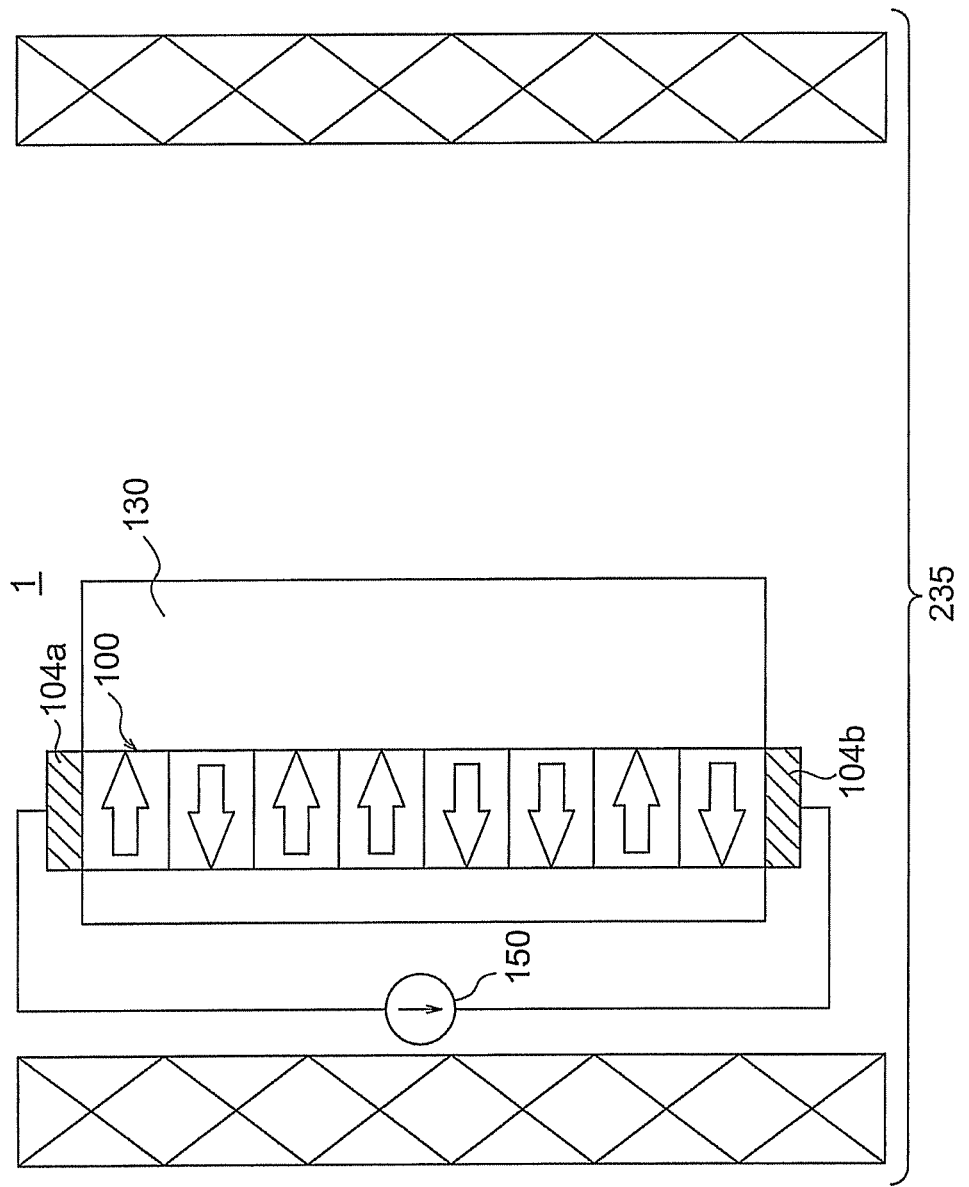
FIG. 19 is a cross-sectional view of a magnetic storage element according to a sixth modification of the third embodiment.

As in a magnetic storage element 1 according to a sixth modification of the third embodiment illustrated in FIG. 19, a coil 235 that surrounds the magnetic storage element 1 and the magnetic layer 130 can be provided, instead of the wiring 230. Spin waves are generated in the magnetic layer 130 by a magnetic field generated by applying a current to the coil 235, and the generated spin waves propagate through the magnetic thin wire 100. In the sixth modification, two or more magnetic storage elements 1 can be provided in the coil 235. In this case, the magnetic field generator (the coil 235) can be shared between the magnetic storage elements 1, and high integration of magnetic storage elements can be advantageously realized.

When an insulating magnetic material is used as the magnetic layer 130 used in the magnetic storage elements 1 of the third embodiment and its modifications, it is preferable to use yttrium iron garnet (YIG) or a ferritic oxide such as manganese ferrite. This is because such materials have small damping coefficients, and can reduce transfer loss of spin waves.

However, the insulating magnetic material is not limited to these materials, and it is possible to use some other magnetic oxide containing iron, cobalt, or nickel, such as spinel oxide or an antiferromagnetic oxide.

Fourth Embodiment

Figure 20:
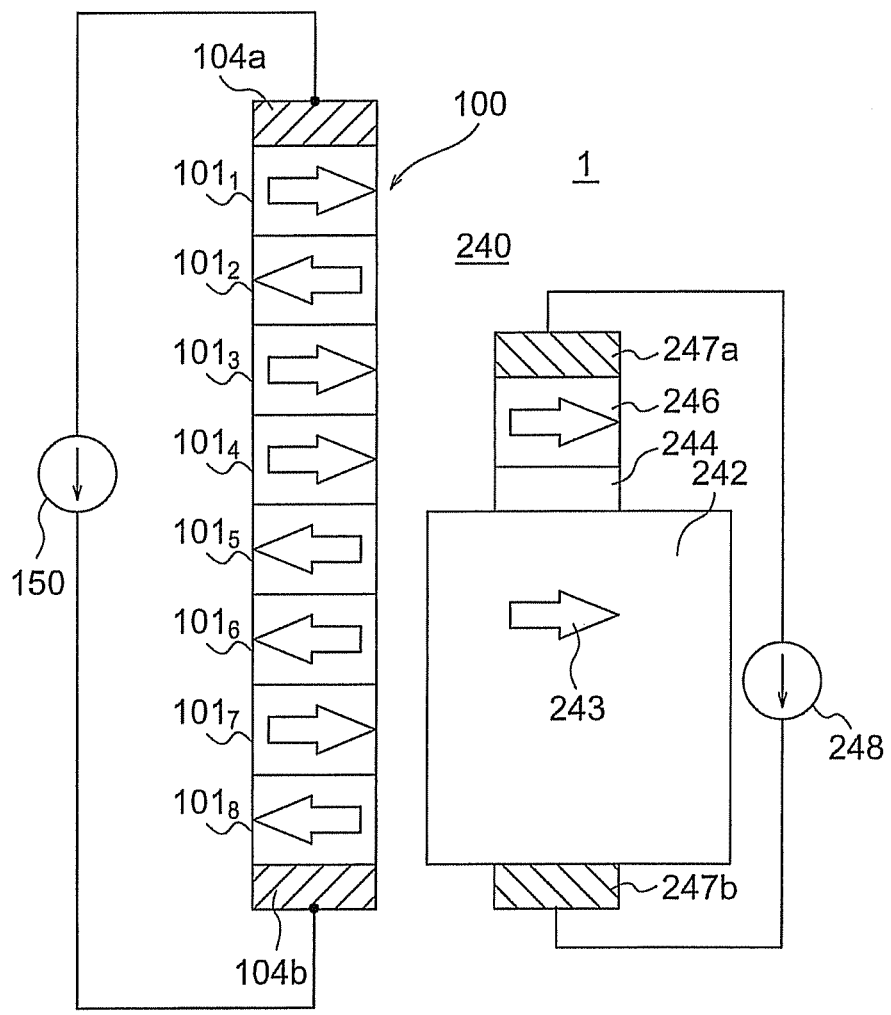
FIG. 20 is a cross-sectional view of a magnetic storage element according to a fourth embodiment.

FIG. 20 shows a magnetic storage element according to a fourth embodiment. The magnetic storage element 1 of the fourth embodiment includes a magnetic thin wire 100 including magnetic domains $101_1$ through $101_n$ (n being an integer), electrodes 104a and 104b applying currents generated from a current source 150 to the magnetic thin wire 100, and a spin wave generator 240. The spin wave generator 240 includes a magnetic layer 242 that is located in the vicinity of the entire magnetic thin wire 100 or part of the magnetic thin wire 100, a nonmagnetic layer 244 formed on the magnetic layer 242, a magnetization fixed layer 246 formed on the nonmagnetic layer 244, and electrodes 247a and 247b applying currents between the magnetic layer 242 and the magnetization fixed layer 246, the currents being generated from a current source 248. Although not shown in the drawing, the magnetic storage element 1 of the fourth embodiment also includes a writing unit and a reading unit, like that of the first embodiment. The magnetization direction of the magnetization fixed layer 246 is fixed. The fixing of the magnetization direction is performed by increasing the film thickness or forming an antiferromagnetic layer on the face on the opposite side from the nonmagnetic layer 244.

In this embodiment, the domain walls in the magnetic thin wire 100 are moved in the following manner. First, from time $t_2$ to time $t_3$, a current is applied from the current source 248. This procedure is called an assisting procedure. When the assisting procedure is carried out, a spin-polarized current flows into the magnetic layer 242, and accordingly, a magnetization 243 at least in a partial region is subjected to a spin torque. As a result, fluctuations occur. The fluctuations in the magnetization 243 propagate as spin waves through the magnetic layer 242. Further, a magnetostatic interaction occurs between the magnetization 243 in the magnetic layer 242 and the magnetization in the magnetic thin wire 100. Therefore, fluctuations are caused in the magnetization in the magnetic thin wire 100, and spin waves propagate through the magnetic thin wire 100. Accordingly, the domain wall widths in the magnetic thin wire 100 become greater than those observed prior to the current application. That is, in this embodiment, the spin wave generator 240 assists a movement of the domain walls, and is also called an assisting unit. The timing to apply a current with the use of the current source 150 is the same as that of the first embodiment.

Figure 21:
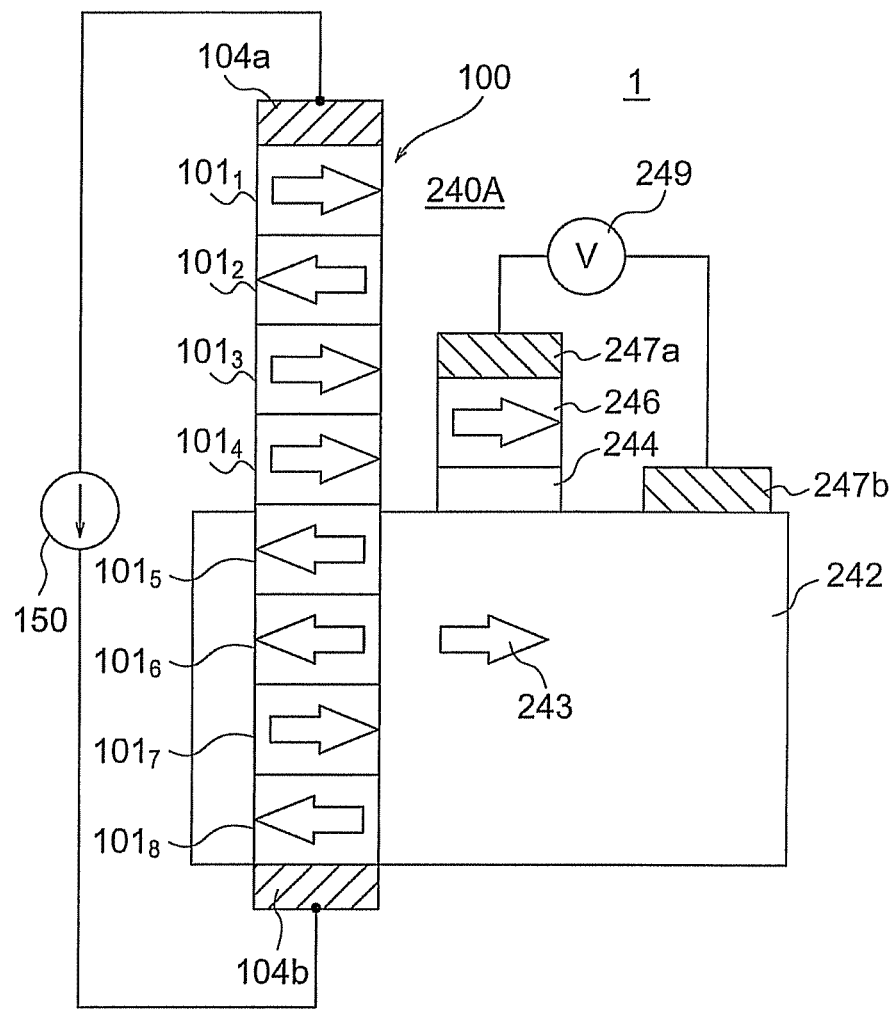
FIG. 21 is a cross-sectional view of a magnetic storage element according to a first modification of the fourth embodiment.

When the magnetic layer 242 is made of an insulator, a spin wave generator 240A having a voltage source 249, instead of the current source 248, can be used, as in a modification of the fourth embodiment illustrated in FIG. 21. Where the magnetic layer 242 is made of an insulator, the magnetic thin wire 100 can be in contact with the magnetic layer 242. Alternatively, all of or part of the magnetic thin wire 100 can be buried in the magnetic layer 242. Since the magnetic thin wire 100 is in direct contact with the magnetic layer 242 as described above, the magnetization fluctuations caused in the magnetic layer 242 can be efficiently transferred through the magnetic thin wire 100, and the domain wall widths in the magnetic thin wire 100 can be made even greater. When the magnetic layer 242 is made of a high-conductivity material, an insulator (not shown) needs to be provided between the magnetic thin wire 100 and the magnetic layer 242, so that the magnetic thin wire 100 and the magnetic layer 242 are electrically insulated from each other.

When a number of magnetic storage elements of this embodiment are used and are arranged in a row, the magnetic layer 242, the nonmagnetic layer 244, and the magnetization fixed layer 246 can be shared between adjacent magnetic storage elements. With this arrangement, high integration of magnetic storage elements can be realized. If a current is not applied to the magnetic thin wire 100 in this case, only spin waves are generated in the magnetic layer 242, and the domain walls in the magnetic thin wire 100 do not move. Accordingly, the respective magnetic elements can be controlled independently of one another.

As described above, in the fourth embodiment, the current density required for the domain walls to transit from a resting state to a moving state can be lowered, and the domain walls can be moved in a stable manner, as in the second embodiment.

Fifth Embodiment

Figure 22:
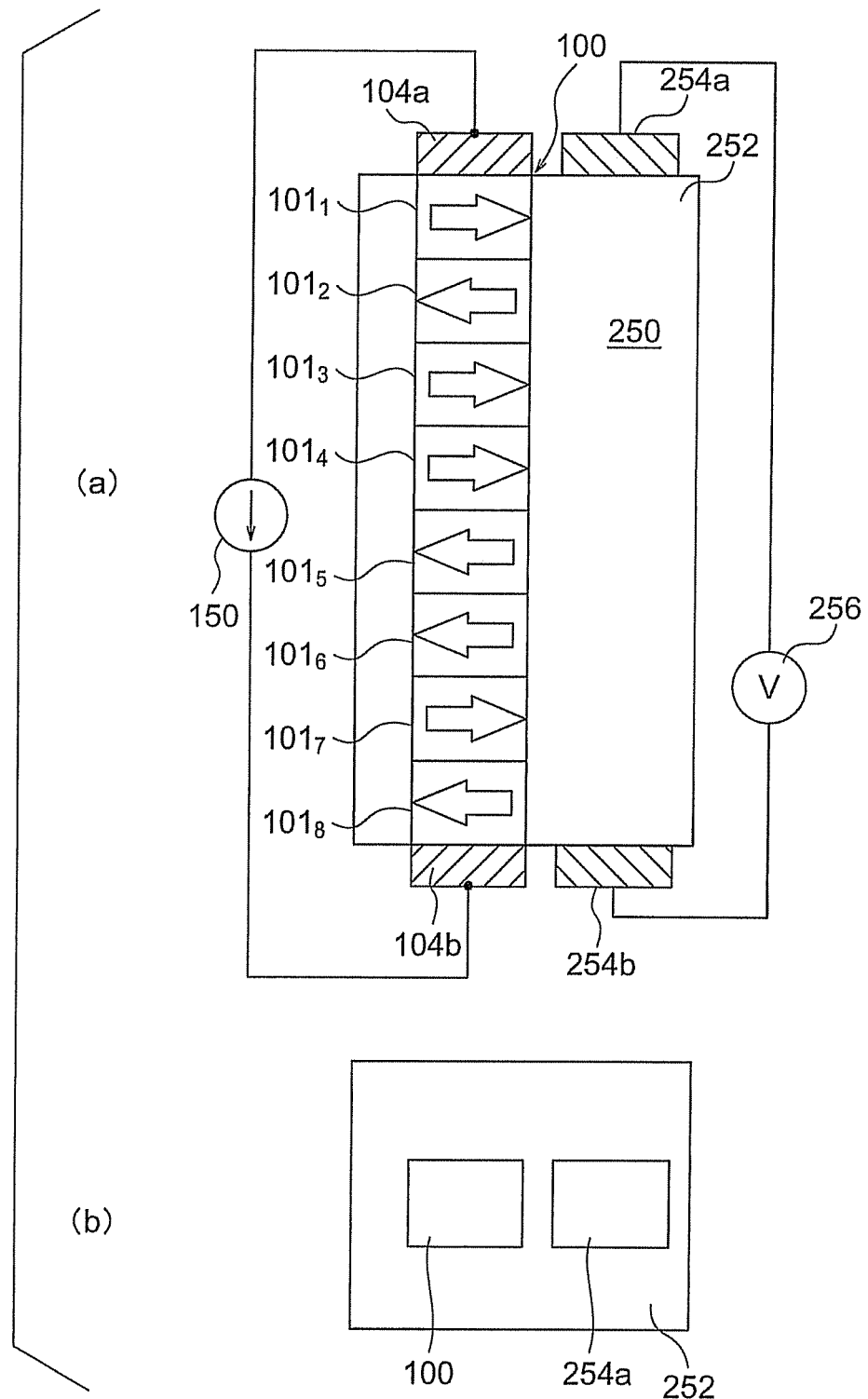
FIGS. 22(a) and 22(b) are diagrams for explaining a magnetic storage element according to a fifth embodiment.

A magnetic storage element according to a fifth embodiment is shown in FIGS. 22(a) and 22(b). FIG. 22(a) is a cross-sectional view of the magnetic storage element 1 of the fifth embodiment. FIG. 22(b) is a top view of the magnetic storage element 1 of the fifth embodiment.

The magnetic storage element 1 of the fifth embodiment includes a magnetic thin wire 100 including magnetic domains $101_1$ through $101_8$, electrodes 104a and 104b applying currents generated from a current source 150 to the magnetic thin wire 100, and a piezoelectric unit 250. The piezoelectric unit 250 includes a piezoelectric layer 252 formed to surround at least a partial region of the magnetic thin wire 100 (all of the region in the drawings), and electrodes 254a and 254b that are formed on the piezoelectric layer 252 and apply voltages generated from a voltage source 256 to the piezoelectric layer 252. Although not shown in the drawings, the magnetic storage element 1 of the fifth embodiment also includes a writing unit and a reading unit, like that of the first embodiment.

In the fifth embodiment, the domain walls are moved in the following manner. First, from time $t_2$ to time $t_3$, a voltage is applied to the electrodes 254. This procedure is called an assisting procedure. When the assisting procedure is carried out, crystal distortions are caused as oscillations in the piezoelectric layer 252, and propagate as elastic waves from the region of the piezoelectric layer 252 in contact with the electrode 254 to the surrounding region through the piezoelectric layer 252. As a result, the magnetic thin wire 100 is subjected to a stress via the interface with the piezoelectric layer 252, and the magnetic anisotropy of the magnetic thin wire 100 is changed by an inverse magnetostriction effect. Fluctuations are then caused in the magnetization in the magnetic thin wire 100. Accordingly, the domain wall widths in the magnetic thin wire 100 become greater than those observed prior to the current application. As a result, the value of the current required for shifting the domain walls can be greatly reduced. That is, in this embodiment, the piezoelectric unit 250 assists movements of the domain walls, and is also called an assisting unit. In the fifth embodiment, a stress is applied to the entire interface between the piezoelectric layer 252 and the magnetic thin wire 100. Distortions are caused in the entire region in the vicinity of the interface in the magnetic thin wire 100, and the domain wall widths in this region become greater. In each embodiment using a current magnetic field generated from a wiring, the effect of the wiring becomes smaller in inverse proportion to the distance. In the fifth embodiment, on the other hand, a uniform effect is applied to the entire domain walls in the relevant region, and the widths can be advantageously increased. Even where the piezoelectric layer 252 is in contact with part of the magnetic thin wire 100, magnetization fluctuations caused by the distortions propagate as spin waves through the magnetic thin wire 100, and are effective to some degree. However, the area of the interface between the piezoelectric layer 252 and the magnetic thin wire 100 is preferably large, as the uniformity of the effect is improved. In particular, if the piezoelectric layer 252 extends along the entire magnetic thin wire 100 in the thin-wire direction, the above mentioned effect can be achieved over the entire magnetic thin wire 100. In one of the most preferable examples, the piezoelectric layer 252 surrounds the magnetic thin wire 100. In such a case, the widths of all the domain walls in the magnetic thin wire 100 can be collectively made greater in a stable manner.

Another advantage of the fifth embodiment is the effect to reduce power consumption. The application of a stress to the magnetic thin wire 100 with the use of the piezoelectric layer 252 is performed by voltage driving. Therefore, the power consumption required for causing distortions is much smaller than that of each embodiment using a current magnetic field generated by a wiring. Accordingly, in combination of a reduction in the current required for moving the domain walls by virtue of the assisting effect achieved by an increase in domain wall width, the power consumption required for moving the domain walls becomes much smaller. The current value required for moving the domain walls can be estimated to be 10 or more times smaller in this embodiment.

The propagation characteristics of the elastic waves propagating through the piezoelectric layer 252 depend on the crystal characteristics of the piezoelectric material, and the elastic waves propagate in a direction depending on the crystal orientation. In particular, uniform surface acoustic waves are excited in a piezoelectric material having monocrystal characteristics or a uniaxial orientation. Therefore, the piezoelectric layer 252 is preferably made of a piezoelectric material having monocrystal characteristics or a uniaxial orientation.

Examples of materials that can be used as the piezoelectric layer 252 include potassium sodium tartrate ($KNaC_4H_4O_6$), zinc oxide (ZnO), aluminum nitride (AlN), lead zirconate titanate (PZT ($Pb(Zr,Ti)O_3$)), lead lanthanum zirconate titanate (PLZT), quartz crystal ($SiO_2$), lithium niobate ($LiNbO_3$), lithium tantalate ($LiTaO_3$), lithium tetraborate ($Li_2B_4O_7$), potassium niobate ($KNbO_3$), langasite crystal ($La_3Ga_5SiO_{14}$, for example), and potassium sodium tartrate tetrahydrate ($KNaC_4H_4O_6 \cdot 4H_2O$). Further, with any of these piezoelectric materials being a base material, an additional element can be added so as to adjust the characteristics. Further, the piezoelectric layer 252 can have a multilayer structure formed by stacking layers made of these materials.

The materials that can be used as the magnetic thin wire 100 in the fifth embodiment are the same as those of the first embodiment. In particular, a great change is caused in magnetic anisotropy of a material having a magnetostriction constant with a large absolute value when a constant stress is applied to the material. Therefore, even when only a small distortion is applied, the magnetization direction greatly changes. Accordingly, the effect to increase the domain wall widths becomes greater, and the current value required for moving the domain walls can be made smaller. Therefore, such a material is preferable. Examples of materials having large magnetostriction constants include alloys of Fe, Co, Ni, Mn, or the like, alloys of platinum and Fe, Co, or Ni, and alloys of a rare earth such as Tb, Sm, or Eu and Fe, Co, or Ni. The materials that can be used as the magnetic thin wire 100 in the fifth embodiment also include materials having magnetostriction constants that are made larger by adding an additional element to the same materials as those of the first embodiment. In one example, a magnetic material having the Ni element added thereto has a magnetostriction constant shifted in the negative direction, compared with a material not having the Ni element added thereto. Accordingly, by increasing the content of the Ni element, a magnetic material having a magnetostriction constant with a negative sign and a large absolute value can be obtained. In another example, a magnetic material having a very small amount of oxygen added thereto has a magnetostriction constant shifted in the positive direction, compared with a material not having oxygen added thereto. Accordingly, by adding oxygen to a magnetic material, a magnetic material having a magnetostriction with a positive sign and a large absolute value can be obtained.

Figure 23:
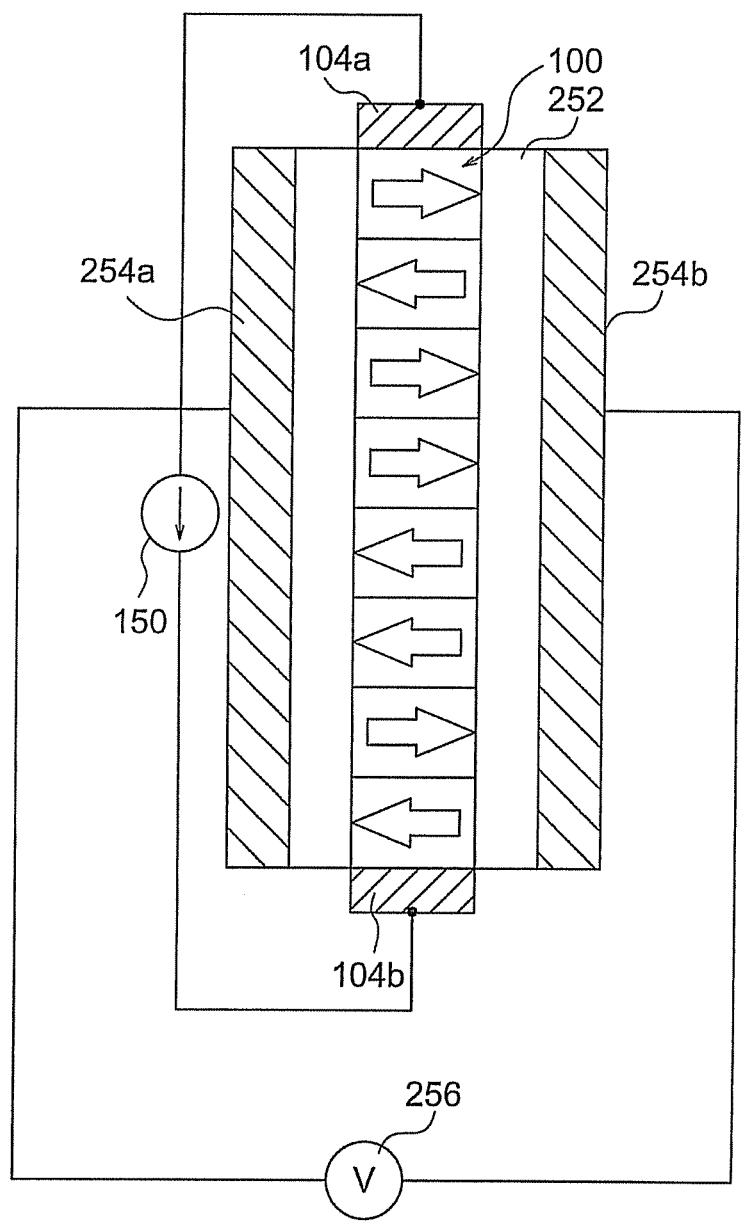
FIG. 23 is a cross-sectional view of a magnetic storage element according to a modification of the fifth embodiment.

A magnetic storage element according to a modification of the fifth embodiment is shown in FIG. 23. In the magnetic storage element of this modification, the electrodes 254a and 254b applying voltages to the piezoelectric layer 252 are parallel to the thin-wire direction of the magnetic thin wire 100. FIG. 23 is a cross-sectional view. In FIG. 23, the piezoelectric layer 252 is formed to surround the magnetic thin wire 100, but each of the electrodes 254a and 254b is provided on part of the piezoelectric layer 252.

Sixth Embodiment

Figure 24:
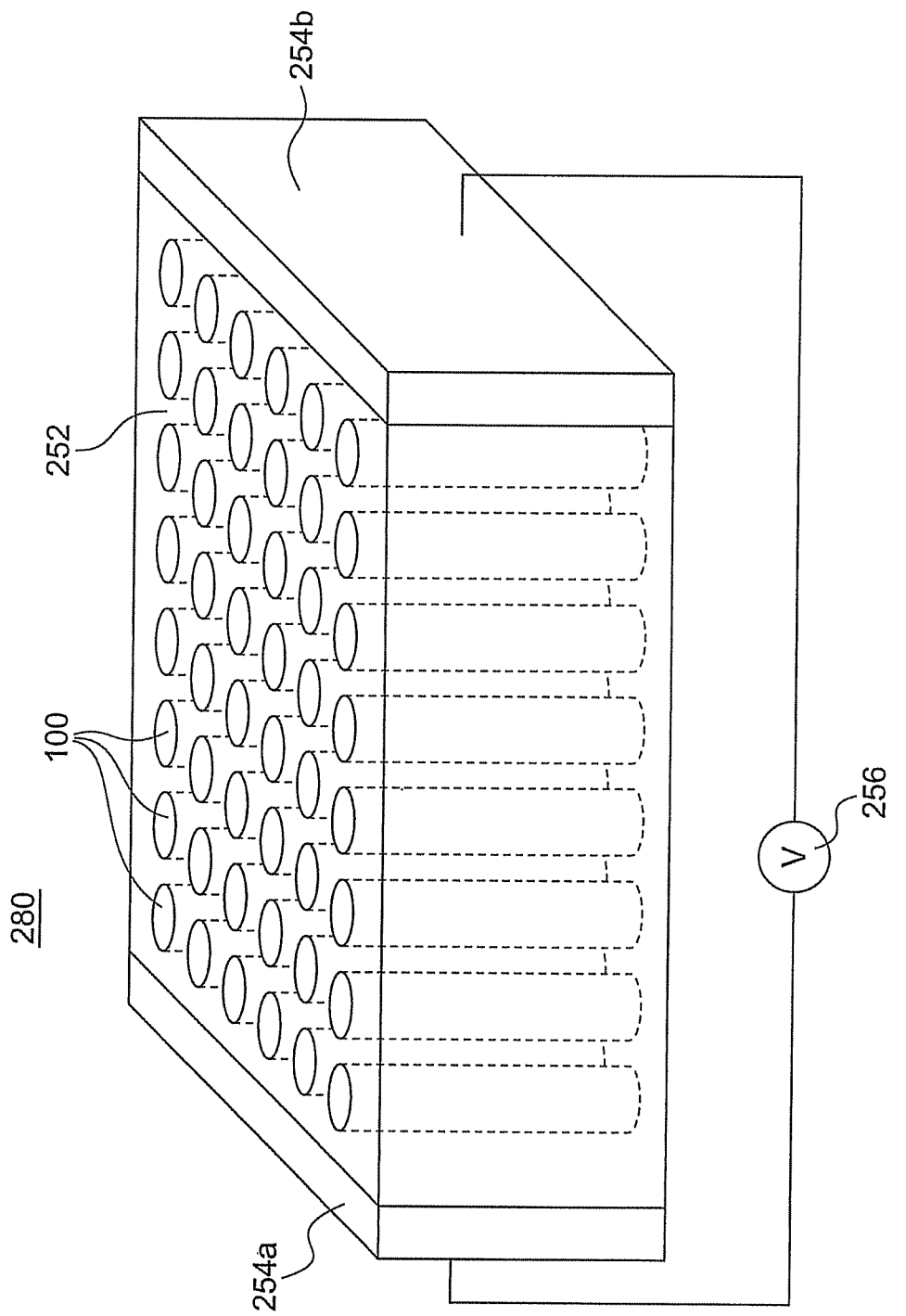
FIG. 24 is a perspective view of a magnetic storage device according to a sixth embodiment.

FIG. 24 shows a magnetic storage device according to a sixth embodiment. As shown in FIG. 24, the magnetic storage device 280 of the sixth embodiment includes magnetic thin wires 100, a piezoelectric layer 252 formed to surround each of the magnetic thin wires 100, and electrodes 254a and 254b applying voltages to the piezoelectric layer 252. Although the piezoelectric layer 252 surrounds each of the magnetic thin wires 100 in FIG. 24, an insulating material such as amorphous $SiO_2$ or amorphous $Al_2O_3$ can be provided between the magnetic thin wires 100 and the piezoelectric layer 252, so as to ensure more reliable insulation.

Although not shown in the drawing, the same electrodes as the electrodes for applying currents to the magnetic thin wire in the magnetic storage element of the fifth embodiment are formed on each of the magnetic thin wires 100, so that currents can flow in the magnetic thin wires 100. Although not shown in the drawing, a magnetic layer is connected to at least one of the magnetic thin wires 100, and the same writing and reading units as those of the fifth embodiment are connected to the magnetic layer. As shown in FIG. 24, in the magnetic storage device 280, piezoelectric driving is performed collectively on the magnetic thin wires 100, to carry out the same assisting procedure as that for the magnetic storage element of the fifth embodiment. Therefore, the domain walls in the magnetic thin wires 100 can be moved through the same procedures as those for the magnetic storage element of the fifth embodiment. Further, the writing method and the reading method are the same as those for the magnetic storage element of the fifth embodiment. That is, the magnetic storage device 280 of the sixth embodiment includes magnetic storage elements of the fifth embodiment, and the magnetic storage elements share an assisting unit.

In the magnetic storage device 280 of the sixth embodiment, the electrodes 254a and 254b applying voltages to the piezoelectric layer 252 are positioned in a direction parallel to the thin-wire direction of each of the magnetic thin wires 100, as shown in FIG. 24. However, the electrodes 254a and 254b can be positioned in a direction perpendicular to the thin-wire directions of the magnetic thin wires 100. Such a structure is shown as a modification of the sixth embodiment in FIG. 25.

Figure 25:
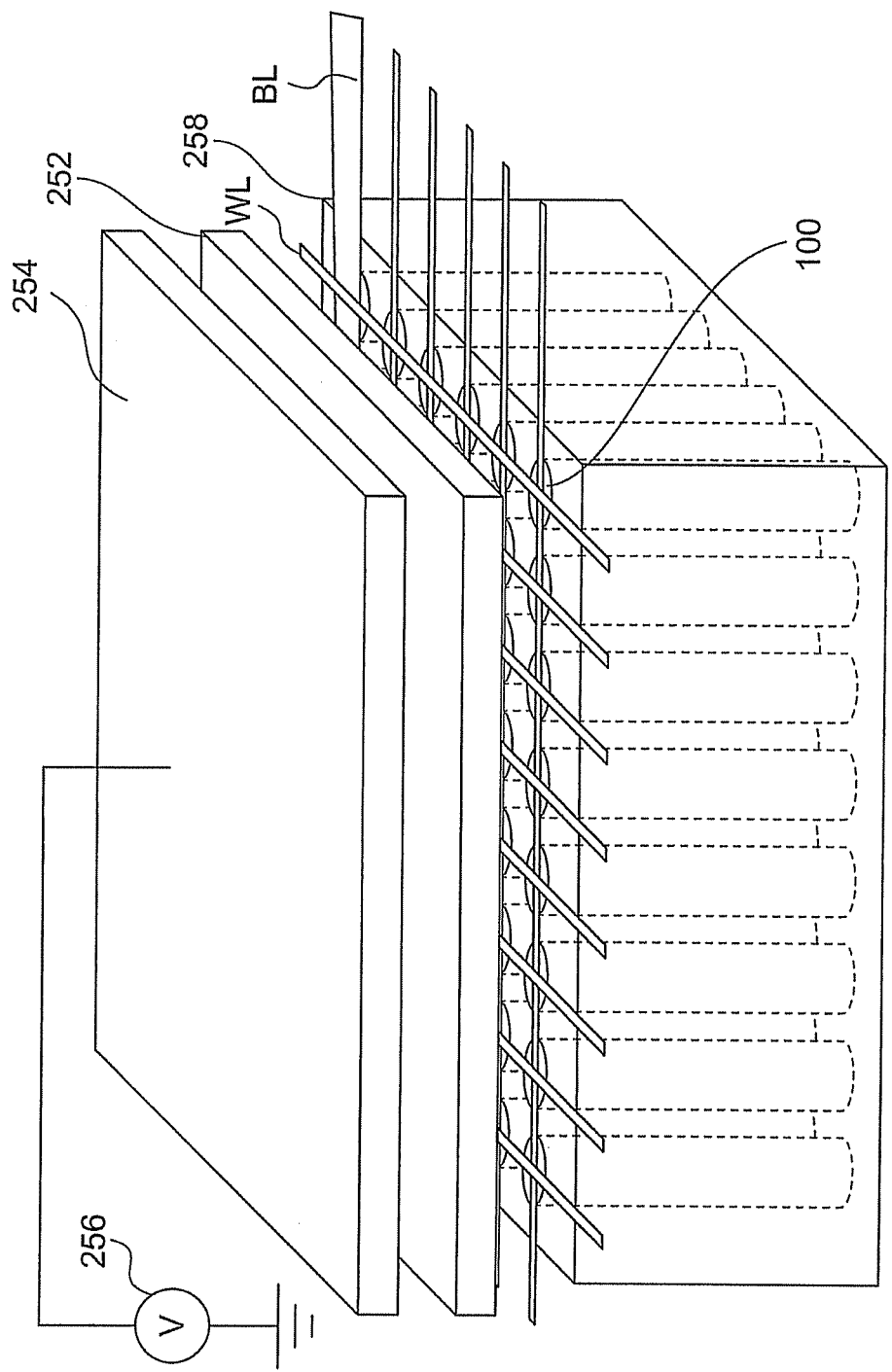
FIG. 25 is a perspective view of a magnetic storage device according to a modification of the sixth embodiment.

As shown in FIG. 25, the magnetic storage device 280A of this modification includes magnetic thin wires 100 arranged in such a matrix form (in the row direction and in the column direction) that the respective thin-wire directions are parallel to one another, and an insulator 258 formed to surround these magnetic thin wires 100. Word lines WL and bit lines BL intersecting with the word lines WL are formed on one of the upper and lower surfaces of the assembly including the magnetic thin wires 100 and the insulator 258. In FIG. 25, the word lines WL and the bit lines BL are formed on the upper face of the assembly including the magnetic thin wires 100 and the insulator 258. The word lines WL correspond to the columns of the magnetic thin wires 100 arranged in the matrix form, and the bit lines BL correspond to the rows of the magnetic thin wires 100 arranged in the matrix form, for example. The face on which the word lines WL and the bit lines BL are formed is parallel to a plane perpendicular to the thin-wire directions of the magnetic thin wires 100. In each of the intersecting regions between the respective word lines WL and the respective bit lines BL, the corresponding word line WL and the corresponding word line BL are in contact with each other, and are also in contact with the upper face of the corresponding magnetic thin wire 100. Further, a piezoelectric layer 252 is formed on the word lines WL and the bit lines BL, and an electrode 254 is formed on the piezoelectric layer 252. The electrode 254 is connected to a voltage source 256 applying a current to the piezoelectric layer 252.

In the modification having the above structure, when a voltage is applied to the electrode 254, crystal distortions are caused as oscillations in the piezoelectric layer 252, and propagate as elastic waves through the piezoelectric layer 252. As a result, the upper face of each of the magnetic thin wires 100 is subjected to a stress via the corresponding word line WL and the corresponding bit line BL, and a change is caused in the magnetic anisotropy in the magnetic thin wire 100 by an inverse magnetostriction effect. Magnetization fluctuations are then caused in the magnetization of the magnetic thin wire 100. Accordingly, the domain wall widths in the magnetic thin wire 100 become greater than those observed prior to the current application. As a result, the current value required for shifting the domain walls can be greatly reduced.

In FIG. 25, the word lines WL and the bit lines BL are formed on the upper face of the assembly including the magnetic thin wires 100 and the insulator 258. However, the word lines WL and the bit lines BL can be formed on the lower face. In such a case, the piezoelectric layer 252 and the electrode 254 can be formed either on the upper face side or on the lower face side.

Figure 26:
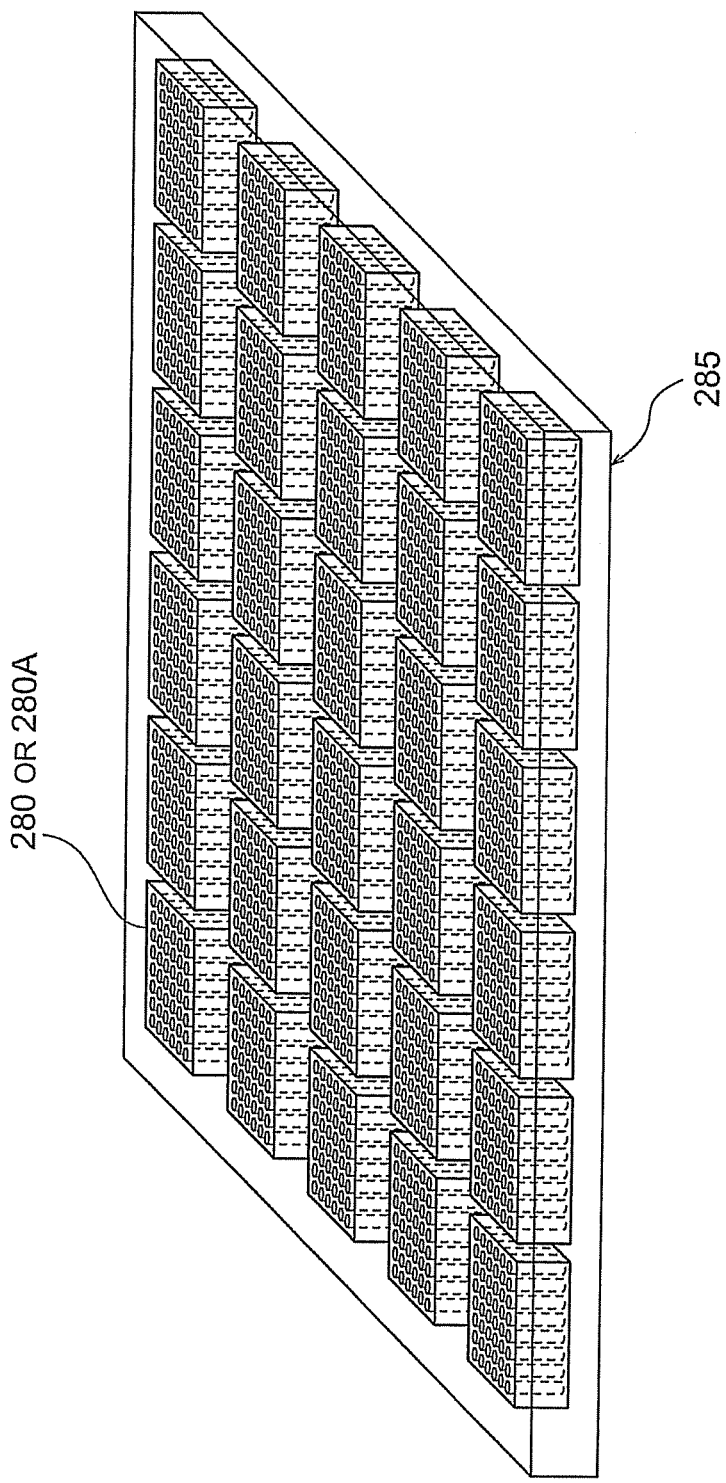
FIG. 26 is a perspective view of a magnetic memory including magnetic storage devices according to the sixth embodiment or the modification of the sixth embodiment.

Further, with the magnetic storage device 280 or 280A shown in FIG. 24 or 25 being one block, a memory chip 285 can be formed by arranging the magnetic storage devices 280 or 280A in the column direction or in the row direction. Such an example structure is shown in FIG. 26. Piezoelectric driving is performed on the blocks independently of one another. However, these blocks are formed on a chip, so that a large-capacity memory chip can be realized. A transistor (not shown) is provided in a layer below the blocks.

Seventh Embodiment

Figure 27:
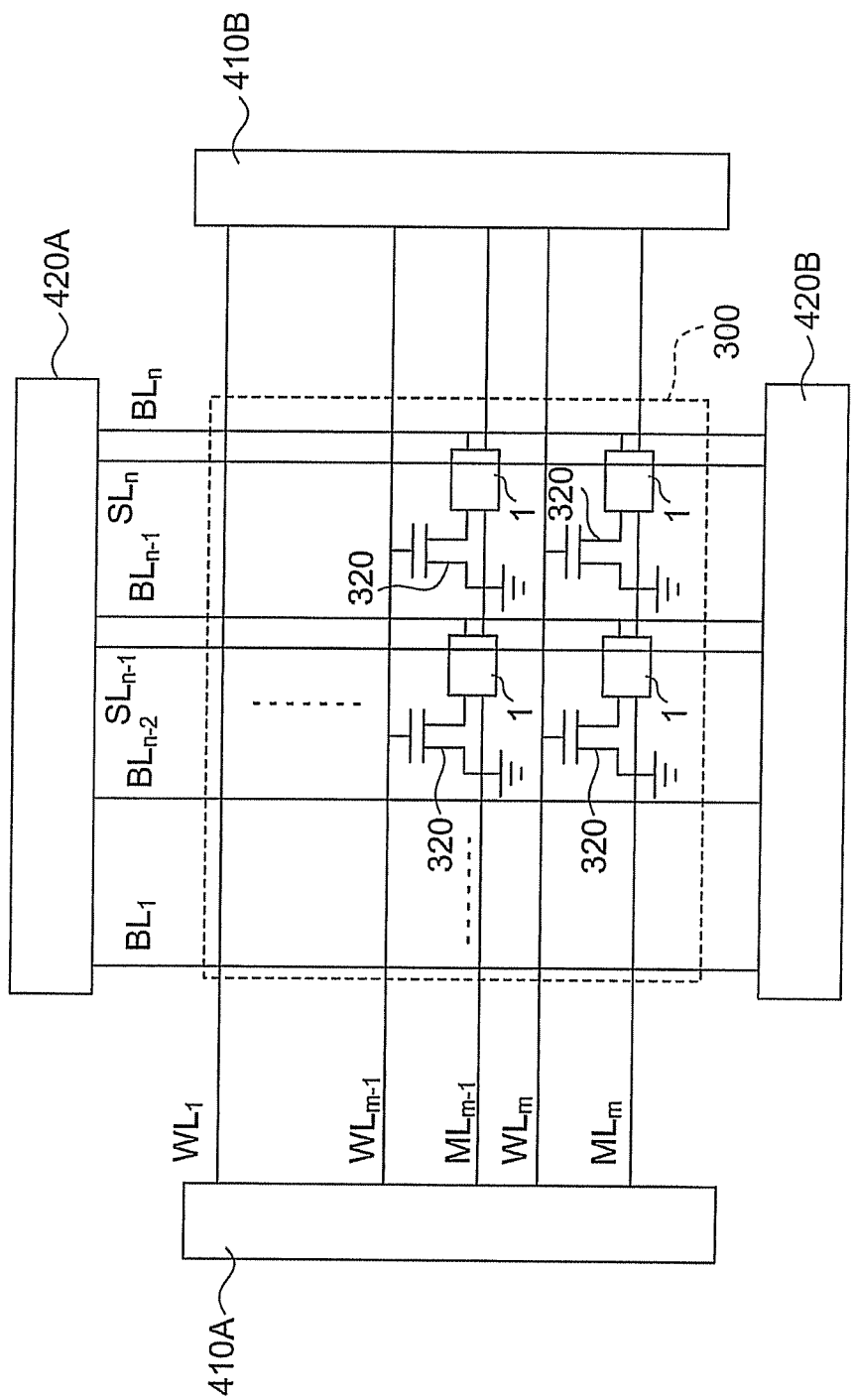
FIG. 27 is a circuit diagram of a magnetic storage device according to a seventh embodiment.
Figure 28:
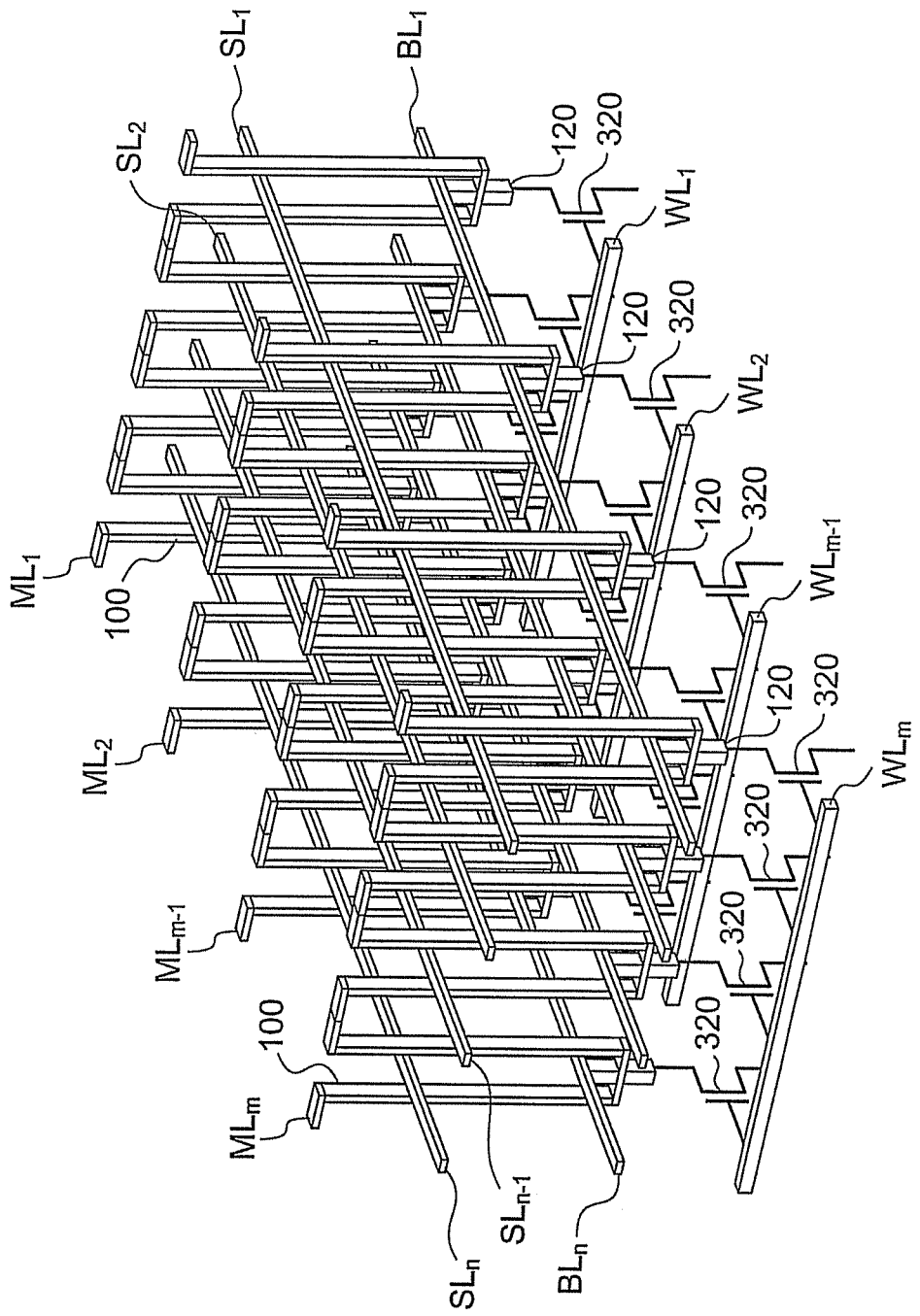
FIG. 28 is a perspective view of the magnetic storage device according to the seventh embodiment.

Referring now to FIGS. 27 and 28, a magnetic storage device according to a seventh embodiment is described. FIG. 27 is a circuit diagram of the magnetic storage device of the seventh embodiment. FIG. 28 is a perspective view of the magnetic storage device of the seventh embodiment.

The magnetic storage device of the seventh embodiment includes a memory cell array 300. This memory cell array 300 includes memory cells arranged in a matrix form, and each of the memory cells includes a magnetic storage element 1 of one of the first through fifth embodiments and their modifications, and a switching element 320 formed with a transistor, for example. In the memory cell array 300, word lines $WL_1$ through $WL_m$ are provided on the respective rows, bit lines $BL_1$ through $BL_n$ for information reading are provided on the respective columns, and assisting lines $SL_1$ through $SL_n$ for carrying out the assisting procedure described in each of the first through fifth embodiments are provided. When the magnetic storage elements 1 are of the first embodiment, for example, the assisting lines SL are the wirings for supplying current magnetic fields to the magnetic thin wires 100 in the magnetic storage elements 1. When the magnetic storage elements 1 are of the second embodiment, the assisting lines SL are the wirings for applying currents to apply spin torques to the magnetic layers connected to the magnetic thin wires 100 in the magnetic storage elements 1. When the magnetic storage elements 1 are of the third embodiment, the assisting lines SL are the wirings for applying current magnetic fields to the magnetic layers in the vicinities of the magnetic thin wires 100 in the magnetic storage elements 1. When the magnetic storage elements 1 are of the fourth embodiment, the assisting lines SL are the wirings for applying currents to apply spin torques to the magnetic layers connected to the magnetic thin wires 100 in the magnetic storage elements 1. When the magnetic storage elements 1 are of the fifth embodiment, the assisting lines SL are the wirings that serve as electrodes to apply voltages to the piezoelectric layers in the vicinities of the magnetic thin wires 100 in the magnetic storage elements 1.

The magnetic thin wires 100 of the magnetic storage elements 1 of the n memory cells on the ith ($1 \le i \le m$) row are connected to form a magnetic thin wire $ML_i$. The magnetic thin wires 100 of the magnetic storage elements 1 are not necessarily connected together. The gate of the switching element 320 of each of the memory cells is connected to the word line $WL_i$ ($1 \le i \le m$) on the corresponding row. The switching element 320 of each memory cell has one terminal connected to one terminal of a reading unit 120 of the magnetic storage element 1 in the same memory cell, and has the other terminal grounded. The other terminal of the reading unit 120 of the magnetic storage element 1 is connected to the bit line $BL_j$ ($1 \le j \le n$) corresponding to the memory cell.

The word lines $WL_1$ through $WL_m$ and the magnetic thin wires $ML_1$ through $ML_m$ are connected to drive circuits 410A and 410B including a decoder for selecting the respective wirings, a write circuit, and the like. Further, the bit lines $BL_1$ through $BL_n$ and the assisting lines $SL_1$ through $SL_n$ are connected to drive circuits 420A and 420B including a decoder for selecting the respective wirings, a reading circuit, and the like. In FIGS. 27 and 28, the writing units of the magnetic storage elements 1 are not shown. One terminal of each writing unit is connected to the switching element for write selecting (not shown), and the other terminal is connected to a current source (not shown). The switching elements for writing can also serve as the switching elements for reading. Alternatively, one reading unit and one writing unit can be provided for more than one memory cell. In such a case, the degree of integration can be made higher. Where each memory cell is provided with one reading unit and one writing unit, as shown in FIGS. 27 and 28, the data transfer rate can be made higher.

To cause a data shift in a memory cell, the decoders in the drive circuits 410A, 410B, 420A, and 420B first decode an address signal input from outside, the magnetic thin wire ML corresponding to the decoded address is selected, and a current is applied to the selected magnetic thin wire ML. A current is then applied to the corresponding assisting line SL at the time described in the first embodiment, and a current magnetic field is generated, when the magnetic storage elements 1 of the memory cells are magnetic storage elements of the first embodiment. When the magnetic storage elements 1 are magnetic storage elements of one of the second through fifth embodiments, a current magnetic field is not generated, but the assisting procedure described in the corresponding embodiment is carried out. The direction in which the domain walls move is the same as the direction in which electrons flow in the magnetic thin wire ML, or is the opposite from the current flowing direction.

To perform writing on a memory cell, the decoders in the drive circuits 410A, 410B, 420A, and 420B first decode an address signal input from outside, the word line WL corresponding to the decoded address is selected, and the corresponding switching element 320 is turned on. A current is then applied to the bit line BL, to perform writing. Alternatively, after the data stored in the corresponding magnetic thin wire ML is moved by a required amount, writing is performed.

To read data stored in a memory cell, the decoders in the drive circuits 410A, 410B, 420A, and 420B first decode an address signal input from outside, the magnetic thin wire ML corresponding to the decoded address is selected, and a data shift is performed in the above described manner so that the bit to be read from the bit string stored as the magnetization direction in the memory cell is moved to the position of the reading unit. After this, the word line WL is selected, the switching element 320 is turned on, and a current is applied to the bit line BL. Thus, reading is performed. The reading current can be oriented in either the positive direction or the negative direction, but has a smaller absolute value than the absolute value of the writing current, so as to prevent inversions of the stored data due to reading.

Although the assisting lines SL are parallel to the bit lines BL in FIGS. 27 and 28, the assisting lines SL can be parallel to the word lines WL or the magnetic thin wires ML. In such a case, an assisting line SL is selected, and the assisting procedure is carried out. By doing so, the assisting procedure is carried out on the magnetic storage elements 1 in the magnetic thin wire ML connected to the assisting line SL or in the vicinity of the assisting line SL. Accordingly, shifts can be simultaneously performed in the magnetic storage elements 1, and the power consumption of the magnetic storage device can be reduced.

Throughout the specification, "being perpendicular" also means a situation where there is a deviation from "being accurately-perpendicular" due to variations and the like during the manufacturing process. Likewise, throughout the specification, "being parallel" and "being horizontal" do not mean "being accurately-parallel" and "being accurately-horizontal."

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A magnetic storage element comprising:
a magnetic thin wire extending in a first direction and having a plurality of magnetic domains partitioned by domain walls;
a first electrode capable of applying a current flowing in the first direction and a current flowing in the opposite direction from the first direction, to the magnetic thin wire; and
an assisting unit receiving an electrical input and assisting movement of the domain walls in an entire or part of the magnetic thin wire,
wherein the assisting unit includes a magnetic layer connected to the magnetic thin wire, a nonmagnetic layer formed on the magnetic layer, a magnetization fixed layer that is formed on the nonmagnetic layer and has a magnetization direction fixed, and a second electrode applying a current between the magnetic layer and the magnetization fixed layer.

2. A magnetic storage element comprising:
a magnetic thin wire in a first direction and having a plurality of magnetic domains partitioned by domain walls;
an electrode capable of applying a current flowing in the first direction and a current flowing in the opposite direction from the first direction, to the magnetic thin wire; and
an assisting unit receiving an electrical input and assisting movement of the domain walls in an entire or part of the magnetic thin wire,
wherein the assisting unit includes a magnetic layer located in the vicinity of at least a partial region of the magnetic thin wire, and a wiring for applying a current magnetic field to the magnetic layer, the current magnetic field being generated by a current flow, and
wherein the magnetic layer is formed to surround at least the partial region of the magnetic thin wire.

3. A magnetic storage element comprising:
a magnetic thin wire in a first direction and having a plurality of magnetic domains partitioned by domain walls;
an electrode capable of applying a current flowing in the first direction and a current flowing in the opposite direction from the first direction, to the magnetic thin wire; and
an assisting unit receiving an electrical input and assisting movement of the domain walls in an entire or part of the magnetic thin wire,
wherein the assisting unit includes a magnetic layer located in the vicinity of at least a partial region of the magnetic thin wire, and a coil for applying a current magnetic field to the magnetic layer, the current magnetic field being generated by a current flow.

4. A magnetic storage element comprising:
a magnetic thin wire in a first direction and having a plurality of magnetic domains partitioned by domain walls;
a first electrode capable of applying a current flowing in the first direction and a current flowing in the opposite direction from the first direction, to the magnetic thin wire; and
an assisting unit receiving an electrical input and assisting movement of the domain walls in an entire or part of the magnetic thin wire,
wherein the assisting unit includes a magnetic layer located in the vicinity of at least a partial region of the magnetic thin wire, a nonmagnetic layer formed on the magnetic layer, a magnetization fixed layer that is formed on the nonmagnetic layer and has a magnetization direction fixed, and a second electrode applying a current between the magnetic layer and the magnetization fixed layer.

5. The element according to claim 3, wherein the magnetic layer is formed to surround at least the partial region of the magnetic thin wire.

6. A magnetic storage element comprising:
a magnetic thin wire in a first direction and having a plurality of magnetic domains partitioned by domain walls;
a first electrode capable of applying a current flowing in the first direction and a current flowing in the opposite direction from the first direction, to the magnetic thin wire; and
an assisting unit receiving an electrical input and assisting movement of the domain walls in an entire or part of the magnetic thin wire,
wherein the assisting unit includes a piezoelectric layer formed to surround at least a partial region of the magnetic thin wire, and a second electrode applying a voltage to the piezoelectric layer.

7. The element according to claim 6, wherein the piezoelectric layer contains at least one of potassium sodium tartrate, zinc oxide, aluminum nitride, lead zirconate titanate, lead lanthanum zirconate titanate, quartz crystal, lithium niobate, lithium tantalate, lithium tetra borate, potassium niobate, langasite crystal, and potassium sodium tartrate tetrahydrate.

8. The element according to claim 6, wherein
the piezoelectric layer is formed at least at one terminal of the magnetic thin wire in the first direction,
the magnetic storage element further comprises a substrate formed in a direction perpendicular to the first direction, and
the magnetic thin wire contains at least one of Co, CoPt, CoCrPt, GdFe, GdCo, GdFeCo, TbFe, TbCo, TbFeCo, GdTbFe, GdTbCo, DyFe, DyCo, or DyFeCo.

9. The element according to claim 6, wherein
the piezoelectric layer is formed to surround the magnetic thin wire in the first direction,
the magnetic storage element further comprises a substrate formed on the opposite side from a side of the piezoelectric layer,
the magnetic thin wire being formed on the side of the piezoelectric layer, and the magnetic thin wire is a film stack including a Co layer and a Ni layer, or contains at least one of Co, CoPt, FePt, GdFe, GdCo, GdFeCo, TbFe, TbCo, TbFeCo, GdTbFe, GdTbCo, DyFe, DyCo, or DyFeCo.

10. A magnetic storage device comprising:
a plurality of magnetic thin wires in a first direction and including a plurality of magnetic domains partitioned by domain walls;
a piezoelectric layer formed to surround each of the magnetic thin wires; and an electrode formed to extend in the first direction and applying a voltage to the piezoelectric layer.

11. A magnetic storage device comprising:
a plurality of magnetic thin wires arranged in a matrix form, each of the magnetic thin wires in a first direction and including a plurality of magnetic domains partitioned by domain walls;
a plurality of first wirings corresponding to columns of the plurality of magnetic thin wires, each of the first wirings being formed on one of an upper face and a lower face of each corresponding one of the magnetic thin wires;
a plurality of second wirings corresponding to rows of the plurality of magnetic thin wires, each of the second wirings being formed on the one of the upper face and the lower face of each corresponding one of the magnetic thin wires;

a piezoelectric layer formed to extend along a plane perpendicular to the first direction; and an electrode that is formed to extend along a plane perpendicular to the first direction, and applies a voltage to the piezoelectric layer.

12. The device according to claim 11, wherein the piezoelectric layer and the electrode are formed on the same side as the one of the upper face and the lower face of each of the magnetic thin wires.

13. The device according to claim 11, wherein the piezoelectric layer and the electrode are formed on a face on the opposite side from the one of the upper face and the lower face of each of the magnetic thin wires.

14. A magnetic memory comprising a plurality of magnetic storage devices of claim 10, the magnetic storage devices being arranged in a matrix form.

* * * * *